United States Patent [19]

Bension et al.

[11] Patent Number: 5,455,072
[45] Date of Patent: Oct. 3, 1995

[54] INITIATION AND BONDING OF DIAMOND AND OTHER THIN FILMS

[76] Inventors: Rouvain M. Bension, 310 Summit Ave., Brookline, Mass. 02146; Larry K. Truesdale, 27 Wetherill La., Chester Springs, Pa. 19425

[21] Appl. No.: 977,675

[22] Filed: Nov. 18, 1992

[51] Int. Cl.$^6$ ............................. C23C 16/00; C23C 16/26
[52] U.S. Cl. ..................... 427/255.7; 427/249; 427/255
[58] Field of Search ................................. 427/249, 255.7, 427/255, 99, 248.1

[56] References Cited

U.S. PATENT DOCUMENTS

| | | | |
|---|---|---|---|
| 4,539,061 | 9/1985 | Sagiv . | |
| 4,908,299 | 3/1990 | Ogawa . | |
| 4,948,629 | 8/1990 | Hacker et al. . | |
| 4,964,972 | 10/1990 | Sagiv et al. | 427/58 |
| 4,968,524 | 11/1990 | Ogawa et al. . | |
| 5,077,085 | 12/1991 | Schnur et al. | 427/58 |
| 5,079,600 | 1/1992 | Schnur et al. . | |
| 5,093,154 | 3/1992 | Hatada et al. | 427/578 |
| 5,106,561 | 4/1992 | Singh et al. | 427/155 |

FOREIGN PATENT DOCUMENTS

| | | |
|---|---|---|
| 1-103991 | 4/1989 | Japan . |
| 3-028190 | 2/1991 | Japan . |
| WO88/02792 | 4/1988 | WIPO . |
| WO89/11897 | 12/1989 | WIPO . |

OTHER PUBLICATIONS

Journal of the American Chemical Society, vol. 114, No. 13, 17 Jun. 1992, pp. 5221–5230.

Swalen, et al, "Molecular Monolayers and Films", Langmuir, 1987, vol. 3, pp. 932–950.

NTIS Publication, "Dept. of the Army U.S. Pat. Appln. No. 451,699, filed Dec. 18, 1989" (AD-D014 369).

Hassenruck, et al, "Mixed Staffanes" as Intermediate–Length Staffs for Molecular–Size Tinkertoys, J. Org. Chem., 1990, vol. 55, pp. 1013–1016.

Whitesides, et al, "Wet Chemical Approaches to the Characterization of Organic Surfaces", Langmuir, 1990, vol. 6, pp. 87–96.

Narayan, et al, "Laser Method for Synthesis and Processing of Continuous Diamond Films on Nondiamond Substrates," Science, 19 Apr. 1991, vol. 252, pp. 416–418.

Morrish, et al, "Effects of surface pretreatments on nucleation and growth of diamond films on a variety of substrates," Appl Phys. Lett., vol. 59, 22 Jul. 1991, pp. 417–419.

Davis et al, "Atomic Layer Epitaxy Group IV Materials: Surface Processes, Thin Films, Devices and Their Characterization", Annual Report, Office of Naval Research, Dec. 1991.

Meilunas, et al, "Nucleation of diamond films on surfaces using carbon clusters", Appl. Phys. Lett., vol. 59, 23 Dec. 1991, pp. 3461–3463.

Sheen, et al, "A New Class of Organized Self–Assembled Monolayers: Alkane Thiols on GaAs (100)" J. Am. Chem. Soc., 1992, vol. 114, pp. 1514–1515.

Heuer, et al, "Innovative Materials Processing Strategies: A Biomimetic Approach", Science, vol. 255, 28 Feb. 1992, pp. 1098–1101.

Primary Examiner—Shrive Beck
Assistant Examiner—Bret Chen

[57] ABSTRACT

A method for forming thin films on substrates. The method includes the steps of forming a self-assembled monolayer film on a substrate where one end of the monolayer bonds to the substrate and the other end forms a surface capable of initiating the formation of a desired film. A preferred method of the invention involves formation of diamond layers over substrates.

17 Claims, No Drawings

INITIATION AND BONDING OF DIAMOND AND OTHER THIN FILMS

BACKGROUND OF THE INVENTION

This invention related to thin film formation over substrates. More particularly, the invention relates to an interlayer thin film comprising a self-assembling monolayer (SAM) of monomers, one end of which are capable of bonding to the substrate, and the other end of which form a surface structurally similar to, and capable of initiating the formation of a material to be deposited. In a preferred embodiment, the invention relates to the initiation and bonding of thin diamond films to substrates.

2. Description of the Prior Art

The synthesis of hard thin coatings such as diamond film is an emerging technology with great commercial potential. The National Research Council, for example, published a monograph on the subject, *Status and Applications of Diamond and Diamond-Like Materials: an Emerging Technology* (National Research Council, Washington, D.C.) 1990, incorporated herein by reference. Organizations such as the Electrochemical Society, the International Society for Optical Engineering, and the Materials Research Society hold regular symposia on advances in the technology.

The target markets and opportunities for films of materials such as diamond are vast. Any object that requires ultimate scratch or wear protection, better slip or sliding properties, better heat removal or input, electrical insulation, or protection from the environment would benefit from a film coating that exhibits the properties of diamond. Coatings on magnetic or optical disks are two such possibilities. Since diamond films are also transparent to electromagnetic radiation with wavelengths between 225 nanometers (hard ultraviolet) and more than 40 microns, the optics in lasers and cameras could be protected from abrasion. A small sample of applications that could be implemented if the technology were available today, include without limitations: protection of windows, such as photocopier glass, bar-code readers, infrared detectors, plastic eyeglass lenses, automobile windows, aircraft canopies, optical fibers, and camera lenses; protection and lubrication of mechanical components, such as bearings, axles, and joints, including those for prosthetic use, and cutting or boring tools; and conductivity of heat in mechanical applications or from electronic components such as high-density semiconductor and integrated circuit chips. An article in the September, 1991 issue of Channel magazine projected the astonishing figure of forty billion dollars for annual sales of diamond products by the year 2000. However, this and other projections make assumptions about the rate of advancement of the technology. It is believed that only two diamond-film products have been commercialized to date: stereophonic tweeters and windows for certain X-ray instruments.

The difficulties that have impeded the commercialization of diamond coating can be classified according to two steps in the growth process: initiation or nucleation of the film, and growth of the film; and according to two properties of the grown film: crystallinity and adhesion.

In the prior art, film growth has been commonly initiated by scratching or rubbing a surface to be coated, or target surface, with diamond powder. Recent research has taken advantage of surfaces resembling diamond to initiate film formation. For example, layers of seed crystals have been deposited, using mechanical and physical means to orient them for use as diamond growth initiators, as disclosed in PCT Application 89 11,897, and in U.S. Pat. No. 5,082,359 incorporated herein by reference.

Molecular initiators are also known. In Applied Physics Letters, vol. 59, p. 3461 (1992), Meilunas et al have reported that a modified fullerene promotes diamond growth with good adherence to the substrate. U.S. Pat. No. 5,075,094 reports on the effects of pretreating substrate surfaces, both carbide- and non-carbide-forming, with diamond grit, evaporated carbon film, and hydrocarbon oils. Davis et al have proposed a study of organic interlayers, including oriented interlayers, as nucleators for diamond growth, on p. 23 of NTIS Report AD-A 244005, December 1991. Linolenic acid and polyimides, particularly the bis(N-phenylmaleimide)ketone, were cited as specific examples, but no attempt was made to orient them, and no suggestion advanced as to how orientation might be accomplished. Finally, Hotsuta et al disclose in Japanese Patent No. 01,103,991 the use of adamantane derivatives for modification of the substrate surface in order to control nucleation of CVD diamond. However, the modification requires immersion of the substrate in, e.g., an aqueous solution of 1-adamantylamine for 24 hours to allow equilibrium adsorption on the substrate. Each of the above references citing molecular initiation is incorporated herein by reference.

Following preparation of a surface to enable initiation, the growth of diamond film is usually carried out by passing a gaseous carbon source over or through an energy zone to decompose the gas into reactive particles. The NRC monograph describes several methods. For example, a stream of gas containing methane as the carbon source can be directed through an array of hot filaments or through a zone of microwave energy, where the methane will decompose into a mixture of atoms, ions and radicals, known as a plasma. Those reactive particles that possess the appropriate energy and orientation, and that strike the nucleated areas at suitable positions, deposit as part of a growing layer. Each of the individual nucleation sites begins to grow roughly hemispherically, until they all grow large enough to contact each other. At this point no room for lateral expansion remains, and all of the material that deposits contributes to increasing the thickness of the layer, at a rate that presently cannot be controlled uniformly. This process is termed chemical vapor deposition, or CVD.

Adhesion of diamond film to a substrate is often unsatisfactory because diamond film has a texture, in atomic dimensions, that usually does not match or fit the texture of the target surface; i.e., the diamond is heteroepitaxial. In some cases, such as on certain metals, the two textures match either perfectly or very closely, i.e., the diamond is homoepitaxial. In homoepitaxial conditions the diamond layer has enough contact points that adhere well to the substrate to provide overall good adhesion. In most cases, however, heteroepitaxial conditions apply, and the amount of contact is insufficient to provide satisfactory adhesion. Some of the research mentioned above in connection with initiation of film growth has attempted to address the adhesion problem. In addition, ion implantation has been studied as a method for promoting film adhesion. In this method, ions or ion clusters are fired into a substrate with sufficient energy to penetrate the surface, or melted in with a laser. By definition, they are fixed in the solid surface, and therefore any layer building on these implants will adhere to the surface in which they are embedded. However, ion implantation is a slow process, and the result is not a crystalline pattern resembling diamond on which a diamond layer can easily form and thicken.

As described in greater detail below, the invention utilizes self-assembling monolayer films. Organized SAMs have been known for many years, but their commercial potential has only recently been considered, for example in a review by Swalen et al in *Langmuir*, volume 3, p. 932 (1987). SAMs with two kinds of reactive groups, silyl and sulfur, at the end to be bonded with the substrate, have been the chief subjects of interest. The former has been recognized and described by Sagiv in U.S. Pat. No. 4,539,061 incorporated herein by reference. His monolayers are assembled chiefly from monomers bearing trichlorosilyl groups at the reactive end, and other groups with the capability of reacting further at the exposed end. The use of such SAM initiating layers to grow enantiomeric amino acid crystals has been disclosed by Landau et al in Nature, vol. 318, p. 353 (1985), but the application of such layers to diamond synthesis was apparently not considered. Other art has appeared using SAMs, also targeted at imaging. U.S. Pat. Nos. 4,908,299 and 4,968,524 both disclose systems similar to those of Sagiv, but bearing vinyl or acetylenic funtions at the exposed ends, which can then be selectively cross-linked to form a pattern. Disclosures of the use of SAMs for similar purposes have been made in U.S. Pat. Nos. 4,439,514 particularly example 23, 5,077,085, and 5,079,600. Each of the aforementioned references disclosing the composition and use of SAMs is incorporated herein by reference.

The sulfur-containing bonding ends have been studied extensively by Whitesides et. al., who reviewed their results in *Langmuir*, vol. 6, p. 87 (1990). Sulfur can react on surfaces which are inert to trichlorosilyl, for example gold. It is interesting that on page 938 of the review by Swalen et al, SAMs with tricholorosilyl and thiol reactive ends are discussed in the third paragraph, and diamond deposition in the fourth, yet in the five years elapsing since the publication of the review, apparently no one has applied SAMs to diamond film synthesis.

Diamond has thus far been the focus herein, because much of the literature on the problems discussed concern diamond. However, many other coatings, especially those with a crystalline, metallic, or alloy composition, require, or would benefit from the adhesive and/or initiating capabilities of the present invention. The field of ceramic coatings is particularly relevant. Indeed, a recent symposium of the MRS, published in the Materials Science Symposium Proceedings, vol. 221 (1991), was devoted exclusively to epitaxial ceramic coatings.

SUMMARY OF THE INVENTION

This invention relates to deposition of thin films, such as diamond, on a substrate. The invention is characterized in part by a new method of initiating deposition, comprising coating a substrate with an initiator that forms a self-assembling molecular monolayer (SAM) on a substrate, where one end of the molecules comprising the monolayer bond to the substrate, and the other end of the molecules, remote from the substrate surface, have a molecular segment capable of initiating deposition of a desired film in a suitable film-growing environment. For brevity, throughout the balance of this specification, the SAM capable of initiating growth of a desired film will be referred from time to time as the "initiator film" and the material from which the initiator film is formed will be referred to as the "initiator composition".

Materials capable of forming SAMs that bond to a substrate are known in the art, described above and discussed in greater detail below. The mechanism by which monolayers bond to a substrate may be by formal covalent bonding, by ionic bonding, or other modes of chemisorption, such as hydrogen bonding. Consequently, provision of a material capable of forming such a layer, able to bond to any of a number of substrates, is known in the art. To render such a material an initiator composition in accordance with the invention, it is reacted with a chemical suitable as an initiator, or with a precursor to such a chemical, such as any of the suitable initiator chemicals well known in the art and described above, to provide an initiator composition of molecules having one end capable of bonding to a substrate, another end capable of initiating thin film growth in the appropriate environment, and an intermediate segment separating the two ends from each other.

In accordance with one embodiment of the invention, there is provided a process for formation of a thin film over a substrate by forming an initiator film over said substrate, where one end of the molecules comprising the film are bonded to the substrate, and the other end of said molecules comprise a segment that is a film-forming initiator, and exposing said film to a film-forming environment.

Another embodiment of this invention comprises a new chemical composition or initiating composition, comprising a self-assembling film-forming material having a segment at one end capable of bonding to a substrate, and a segment at its other end capable of initiating thin film formation when exposed to an appropriate environment.

In yet another embodiment of this invention, there is provided new coatings characterized by improved molecular and/or crystal uniformity, and new articles of manufacture formed by practice of the process of the invention characterized by said new coating and enhanced adhesion to its underlying substrate.

DESCRIPTION OF THE PREFERRED EMBODIMENTS

As stated above, this invention relates to a method for depositing diamond and other thin films by providing an initiator film over a substrate. The initiator film has a segment attached to one end thereof capable of initiating a desired film such as diamond; borides, carbides, silicides, nitrides, or phosphides; or binary, ternary, and higher order mixtures, such as mixed carbides and nitrides, for example of titanium. Such initiators are known to the art. An advantage to use of the initiating film is the simultaneous provision of good initiation and good adhesion of the film to a wide variety of substrates. In addition, because the initiating film provides an initiating surface already resembling a desired final film, the problem of nucleation at myriad isolated sites is avoided. The invention may be advantageous even in cases in which a coating with a less ordered structure is desired, e.g., diamond-like carbon or diamond-like hydrocarbon. Moreover the initiating film may readily be applied to a substrate by a room-temperature wet-chemical process, and consequently, rigorous conditions that might be required for the initiation step, such as temperatures that might damage the substrate, can be avoided.

PREPARATION OF THE FILMS

The preparation of films according to the invention consists of three steps: provision of an initiator composition; formation of an initiator film; and formation of a desired film by exposure to a film-forming environment.

a. Preparation of the Initiator Composition

The initiator composition suitable for use in the present invention comprises molecules capable of forming SAMs. The molecules have three segments: (1) a bonding segment B that attaches the molecule to a substrate; (2) an initiator segment I at the end of the monolayer in contact with a film growth environment chosen for its ability to initiate film growth; and (3) a connecting segment C separating the initiating segment from the bonding segment.

Any bonding segment capable of forming a bond to a desired substrate with a strength sufficient for the conditions under which the surface will be employed is suitable. Such segments are known to the art and some specific examples include silane functions, e.g., mono-, di-, and trichlorosilanes or alkoxysilanes; silanols, silazanes; tin functions; thio functions, e.g., thiol, sulfide, disulfide; sulfate or sulfonic groups; phosphines; phosphate groups; titanates; zirconates; boranes or boronic acid groups; aluminates; carboxylic groups, amides, acyl halides, hydrazides; amines; pyridine groups; hydrazines; isonitriles; diazonium salts; halides; aldehyde groups; and hydroxyl groups. The interaction between the initiator film and the substrate depends on the nature of the substrate as well as that of the bonding segment. For example, silane functionalities are preferred for glass, silicon, and silicon oxides, especially the trichlorosilyl functionality, while thio functionalities are preferred for gold and gallium arsenide, especially the thiol functionality.

The initiating segments of the molecule are comprised of those groups capable of initiating the formation of a desired film. Again, suitable initiators are known to the art. In the simplest embodiment, they may include methyl groups, vinyl (ethylenic) groups, or acetylenic groups. If these groups are connected to the bonding segments using hydrocarbon chains, then the initiator composition contains segments that are "oily", as in U. S. Pat. No. 5,075,094, mentioned above. An advantage of initiator compositions with vinyl or acetylentic groups is a low hydrogen/carbon ratio.

In another embodiment the initiating segment can be rings of carbon atoms, such as cyclopropyl, cyclobutyl, cyclopentyl, cyclohexyl, or their unsaturated analogs, including the aromatics such as benzene. It is also possible to use fused rings, e.g., steroid or naphthalene systems. Fused 2-ring systems have been proposed as diamond-initiators by Angus et al in Carbon, vol. 28, p. 745 (1990), incorporated herein by reference. Although the aromatic compounds can be thought of as precursors to graphite, an undesirable competing product with diamond, the conclusion that graphite can nucleate diamond has been published by several investigators, e.g., Avigal in Diamond and Related Materials, vol. 1, p. 216 (1992), and consequently, aromatic systems are contemplated herein.

A preferred embodiment of the invention employs cage compounds, also known to the art as diamond initiators. Molecules like adamantane, diamantane (congressane), and cubane have been disclosed as feeds in diamond film synthesis, for example, in PCT International Application WO 88/02792. The latter compound has been claimed as the basis structure for a coating of a new form of carbon termed "supercubane" in U. S. Pat. No. 5,110,577.

Cage compounds have three advantages. First, they possess only $sp^3$ carbon atoms, i.e., carbon atoms with four other substituents as in diamond, rather than $Sp^2$ carbon atoms with only three other substituents and concomitant unsaturation, characteristic of graphite. Thus, such feeds have a reduced chance of converting to graphite, a well-known competing product that can arise during diamond thin-film synthesis.

A second advantage is that not only do such compounds possess $sp^3$ carbons, but they actually resemble diamond to such a degree that adamantane and its homologs are termed "diamondold hydrocarbons". Methane ($CH_4$), an inexpensive and often-used diamond film feed, by contrast has a tetrasubstituted $sp^3$ carbon atom, but cannot be said to resemble diamond in the same way that adamantane does. One of the features of cage compounds is that they are not merely fused rings, but possess the fundamental features of a three-dimensional crystalline lattice, distinguishing them from fused polycyclic compounds such as decalin or the steroids. These two advantages are the basis of a proposal, by Matsumoto and Matsui in the Journal of Materials Science, vol. 18, p. 1785 (1983), incorporated herein by reference, to use certain cage compounds not as feeds, but as initiators.

A third advantage to cage compounds is a low hydrogen/carbon ratio. Since diamond is essentially pure carbon, any other element introduced during synthesis should be eliminated. One way is to use elemental carbon that has been vaporized at a remote location and then introduced to the vapor deposition chamber. This method is termed physical vapor deposition (PVD), as opposed to the CVD method described previously, because the material both begins and ends as elemental carbon. However, the vaporized carbon does not necessarily retain its $sp^3$ character as the carbons of the cage compounds do. Therefore, such compounds that bear a minimum number of hydrogens on the carbon skeleton present the optimum combination of $sp^3$ carbons and minimum amounts of other elements. It should be pointed out that hydrogen/carbon ratio is mentioned because such compounds are usually less expensive than the analogs with other atoms, and because diamond, an all-carbon coating, is the preferred embodiment. However, there may be situations in which cage compounds containing atoms other than carbon and hydrogen are acceptable or even desirable, either incorporated into the cage skeleton, or as substituents on it.

Among the cage structures suitable for initiators are those aliphatic groups following the general nomenclature "kcyclo(l.m.n.)alkx" in which k is at least bi, at least three terms l, m, and n are at least 1, x is a suffix ending in yl, enyl, or ynyl, the bridgehead atoms are $sp^3$ carbons, and the substituent/cage-skeleton atom ratio is less than 2. Substituent/cage-skeleton atom ratios of less than 1.6 are especially preferable. Examples of suitable groups are derivatives of adamantane (tricyclo(3.3.1.1$^{3,7}$)decane), barrelene (bicyclo-(2.2.2)octa-2,5,7-triene), bullvalene (tricyclo(3.3.2.=0$^{2,}$8)deca-3,6,9-triene), cubane (pentacyclo(4.2.0.0$^{2,5}$.0$^{3,8}$.0$^{4,7}$)=octane) and its homologs such as homocubane (pentacyclo= (4.3.0.0$^{2,5}$.0$^{3,8}$.0$^{4,7}$)nonane), 1,3-bishomocubane (pentacyclo(4.3=.0.0$^{2,5}$.0$^{3,9}$.0$^{4,8}$)decane), and basketane (pentacyclo(4.4.0.0$^{2,5}$=.0$^{3,8}$.0$^{4,7}$decane), tetracyclo(4.4.0.1$^{3,9}$.1$^{4,8}$)dodecane, diamantane (pentacyclo(7.3.1$^{14,12}$.0$^{2,7}$.0$^{6,11}$)tetradecane or decahydro-3, 5,1,7=(1.2.3.4)butanetetraylnaphthalene), hexacyclo(5.5.1.1$^{2,6}$.1$^{8,12}$=.0$^{3,11}$.0$^{5,9}$)pentadecane, propellane (bicyclo(1.1.1)pentane), and twistane (tricyclo(4.4.0.0$^{3,}$8)decane) (253-14-5).

This nomenclature does not exclude other cage derivatives such as dodecahedrane (hexadecahydro-5,2,1,6,3,4-(2,3)butanediyl(1,4)=diylidenedipentaleno(2,1,6-cde:2',1',6'-gha)pentalene (6909-37-=1), pagodane (hexahydro-2,7,8b,3,4b,6-ethanediylidenedipentaleno=(1,6-ab:1',6'-ef)pentalene) (89683-62-5), and semibullvalene (2a,2b, 4a, 4b-tetrahydrocyclopropa(cd)pentalene) (6909-37-1).

Of these initiating segments, the adamantyl, diamantyl, and cubyl derivatives are especially preferred. Diamantane has in fact been proposed as a starting material for SAMs by Cahill, in Tetrahedron Letters, vol. 31, p. 5417 (1990), but without any explanation of how to make a SAM from it, or suggestions for application of such a SAM.

Ultimately, even crystals can be employed as initiating segments, provided that they are capable of self-assembly into well-ordered monolayers. The deposition of SAMs from monomers functionalized with nanocrystals at the exposed ends has been reported by Colvin et al in the Journal of the American Chemical Society, vol. 114, p. 5221 (1992), but only for the purpose of studying the monolayer. No suggestion for use as a seed layer is made, and the authors admit that "ordered systems . . . are not necessary for this application" (p. 5229).

The initiating surface of the present invention desirably resembles the material of which the desired film is made in two ways: crystal structure, and atom composition and distribution. The preparation of a textured surface is an object of the present invention in order to provide textures resembling the crystal lattice of the material to be deposited. For example, diamond has a cubic lattice, but a modified form known as Lonsdaleite has a hexagonal lattice. The National Research Council monograph, cited earlier, reports that the octahedron is the predominant growth form. It also suggests the use of stable carbides as diamond nucleation centers, one of which, silicon carbide, has been employed for this purpose. The present invention is capable of providing initiating surfaces for any of these configurations.

Silicon carbide and other coatings with non-carbon components may be better initiated by a layer reflecting atom compositions and distributions similar to their own, especially if their crystal structure is different from that of diamond. Thus, in another embodiment of the present invention the initiating groups contain certain heteroatoms. For example, if deposition of a carbon nitride layer is desired, it may be preferable to synthesize an initiating layer comprising a mixture of initiator compositions, i.e., with initiating segments containing both carbon and nitrogen. In the first embodiment described above, such segments might be methyl and amino, or vinyl and imino, or acetylenic and nitrile, or combinations of these groups. Other coatings such as carbides and nitrides of boron, silicon, titanium, and tungsten can employ initiating segments containing heteroatoms appropriate for the composition of the coating, as long as the SAM is processed in such a manner as to avoid premature reaction of those groups that are sensitive to air, moisture, or other environmental factors.

Ring compounds can also contain heteroatoms. For example, piperidine or piperazine are analogs of cyclohexane containing one and two nitrogen atoms, respectively; pyridine and pyrazine are the respective analogs of benzene. The chemistry and scope of heterocyclic ring compounds is so well known that no further elaboration is necessary. Even suitable inorganic ring systems are available; the nucleating effect of borazine on the growth of boron-nitride coatings, for example, has been reported by Gates et al in the Journal of Applied Physics, vol. 72, p. 246 (1992).

Many cage compounds also have analogs containing heteroatoms in the cage skeleton. For example, triazaadamantane (1,3,5-triazatricyclo(3.3.1.1$^{3,7}$)decane) is the three-dimensional analog of the methyl/amino initiating segment combination, but cage compounds containing silicon and nitrogen, boron, boron and carbon, aluminum and nitrogen, and sulfur and nitrogen, among others, are by now well known in the literature. This area of chemistry is of particular interest at the present time, and it is anticipated that many compounds obviously suitable for the present invention, but not presently available, will be synthesized. One example is the azacubanes, which have been predicted to be more stable than cubane itself, on the basis of theoretical calculations, but have not been synthesized to date. The suitability of nanocrystals was disclosed earlier, and very large diamandoid molecules fitting this description may eventually be synthesized. In fact, approaches to such molecules have been discussed by Shen et al in the Journal of the American Chemical Society, vol. 114, p. 497 (1992), focusing on "superadamantane".

The initiating segments need not be monomeric themselves, but may be dimers, trimers, oligomers, or polymers. For example, the initiating segment may be a propellane-propellane dimer, a cubane-propellane dimer, a cubane-cubane dimer, etc. The synthesis and properties of such dimers, termed "staffanes" and "mixed staffanes" has been reported by Michl and coworkers in the *Journal of Organic Chemistry*, vol. 55, p. 1013 (1990). The scope of such groups need not be limited to hydrocarbons, or even to cages. Dimers, trimers, oligomers, or even polymers of hydrocarbon cages with heteroatom cages, hydrocarbon rings with heterocycles, and cage compounds with ring systems are also suitable.

Although connecting segments are not always necessary, they are often desirable, because of their ability to facilitate self-assembly, and because of certain advantages they bestow on the materials properties of the finished film. For example, hydrocarbon-chain C segments in an initiating layer may be capable of mitigating thermal or mechanical stresses that would have a detrimental effect in the absence of the C segment. Requirements for connecting segments have been given by Sagiv, but will be summarized here with some additions. Suitable connecting segments are those possessing structures compatible with self-association into compact, ordered arrays. Rod-like shapes with elongated, non-polar moieties or disc-like, flattened shapes are good criteria for such groups. Examples of the former are derivatives of straight-chain aliphatic backbones, polyethoxy backbones, polysiloxy backbones and steroids. Examples of the latter are derivatives of sugars, crown ethers, phthalocyanines, porphyrins, and cyclodextrins.

Chains of initiator segments are also suitable. For example, chains could be comprised of cage compounds, such as diamantane, mentioned in the previously cited article by Cahill. In fact, a hydrocarbon chain employed as a connecting segment may also function as a polymerized methyl group initiator segment. In this case the initiator composition could also be defined as possessing only a bonding segment and an oligomeric or polymeric initiating segment. The specification of straight-chain backbones does not exclude branches from the backbones, as long as a branch contains no more than one atom possessing a valence with an absolute value other than 1.

It may be desirable in certain cases to synthesize initiator compositions with one bonding segment and two or more initiating segments, for example if three terminal methyl, vinyl, or acetylenic groups are bonded to one connecting segment, or a mixture of initiating segments in a particular proportion and/or a particular orientation with respect to each other is desired. Conversely, certain initiating segments may require anchoring by two bonding segments for each, for example to hold a particular axis of the initiating segment parallel to the substrate surface or when the initiating segment is so large that orderly assembly of the chains would be prevented by crowding of the initiating segments. In the former case the connecting group could be branched, or the initiating segment could be attached to two connecting segments. In the latter case, spacer or filler compositions with the structure B-C, lacking the initiating segment, can be included with the initiator compositions B—C—I. SAMs with such compositions have, in fact, been published by Maoz, Netzer, Gun and Sagiv on p. 1069 of an article in the Journal de Chimie Physique, vol. 85, p. 1059 (1988). The initiating segment can also be oriented in different ways with respect to the connecting group by varying the position of attachment. For example, adamantane, although a highly symmetric molecule, does possess two non-equivalent sets of carbon atoms, the 1-position (bridgehead atoms) and the 2-position (bridging atoms). An adamantyl-C-B monolayer in which all the adamantyl groups are substituted at the 1-position will present a surface with a texture different from that in which the all adamantyls are substituted at the 2-position, or some at the 1- and others at the 2-position.

Mixed-structure connecting segments are also suitable, e.g., a chain composed of a hydrocarbon portion bonded to a fluorinated or polyethylene glycol portion. The preferred connecting segments are straight carbon-backbone chains of between eighteen and twenty-two carbon atoms, and those saturated either with hydrogen or fluorine are especially preferred.

Synthesis of the initiator compositions can be carried out by conventional chemical methods well known in the art. The synthesis of the preferred embodiment employing cage structures is the most elaborate. In general it is accomplished in three steps: formation of the cage structure, functionalized at a desired skeleton atom; establishment of a chain at the fuctionalized skeleton atom, and extension of the chain to the desired length; functionalization of the chain end with the desired initiating segment. Synthesis of related initiator compositions, i.e., useful for self-assembly, but in imaging applications rather than as an initiating layer for a coating material, have been published separately by Sagiv and Whitesides.

In the least complicated procedures, the functionalized cage compounds are available commercially, e.g., bromoadamantane. In other cases the cage compounds are not commercially available, and skeletons must be both synthesized and functionalized. Preparation of the diamantane skeleton, for example, from norbornadiene via Binor-S has been published in Organic Syntheses. It can then be brominated or carboxylated to provide a site for attachment of the connecting segment. Preparation of the cubyl skeleton is more elaborate, involving dimerization of 2-cyclopentenone, protection of one carbonyl group and photochemical removal of the other resulting in ring closure to the bishomocubane, a Favorskii-type ring contraction to the homocubyl carboxylic acid, and photochemical decarboxylation followed by ketal deprotection to yield cubanecarboxylic acid. Conversion to the more useful iodide requires esterification, via the acid chloride, with N-hydroxypyridine-2-thione and photochemical reaction in the presence of trifluoroiodoethane.

The connecting segment may be formed in several ways. One way is addition of bromoadamantane to ethylene in a reaction of the Friedel-Crafts type. The resulting 2-carbon chain can be extended to the desired length via the malonic ester synthesis, converting the ester back to the bromide with lithium aluminum hydride followed by HBr after each malonic ester addition.

Another method for is metallation of the cage halide to yield, e.g., adamantyl Grignard reagent or cubyllithium, followed by addition of oxirane or oxetane, conversion of the resulting alcohol to the bromide and generation of the Grignard reagent; and repetition of these steps until the chain has reached its desired length.

A third method is coupling of the 2-carbon chain with a long chain such as methyl 16-iodohexadecanoate, via the lithium cuprate, and reduction to the alcohol, with lithium aluminum hydride, for example. The methyl 16-iodohexadecanoate can be prepared from hexadecanoic acid, available commercially.

Some cage structures are more easily formed from a functionalized connecting segment. A long-chain aldehyde in 40% formaldehyde dissolved in 1:1 ethanol:water can be converted by KOH to the tris hydroxymethyl derivative. The tris-azide is formed via the sulfonate ester and reduced to the amine with, e.g., lithium aluminum hydride. Reaction with formaldehyde yields the triazaadamantane cage skeleton functionalized with a long chain.

Bonding segments are added, in general, by reaction of the bromide function at the chain end with sodium metal and thioacetic acid, followed by acid cleavage of the thio ester, to yield a thiol bonding segment. Alternatively, the bromide may be converted to the Grignard reagent, followed by treatment with tetrachlorosilane, to yield a trichlorsilyl bonding segment. In the case of the triazaadamantane cage, the halogens are avoided, and triethoxysilane can be added across a terminal olefinic bond by, e.g., heterogeneous catalytic hydrosilylation.

b. Monolayer Assembly

Assembly of the monolayer may require preparation of the substrate surface, which depends on the surface to be treated. Examples of suitable surfaces are glass, alumina, aluminum, chromium, copper, gold, gallium arsenide, germanium, platinum, silicon, silver, zinc selenide, poly(vinyl acetate), and polyethylene. Gold and other metal surfaces are usually prepared clean by evaporation/deposition and plasma treatment. Glass surfaces are prepared by procedures involving ultrasonic cleaning. Poly(vinyl acetate) preparation involves stretch orientation.

Following treatment, the substrate surface is immersed in a solution of the initiator composition for a time sufficient to allow the monolayer to assemble completely, usually within a few minutes. Some surfaces require more rigorous conditions. A gallium arsenide surface, for example, requires coating with molten thiol at 100° C. under nitrogen.

Any of these substrates may themselves be thin coatings on thicker supports. Gold, for example, has been vaporized by resistive heating on a tungsten filament and deposited as a thin layer on silicon. Polymers can also be coated onto thicker supports, if desired, for example by casting from solution. In fact, a monolayer itself can be considered a polymer in the broad sense of the term, and can serve as a support for the SAM of the present invention.

In the ideal case, each initiator composition would bind to the target surface as it fits itself into the monolayer. Practically, however, the only requirement is that an adequate amount of the initiator composition bind to the surface to promote an overall monolayer bond of sufficient strength. In certain cases, the integrity and adherence of certain such fractionally bonding monolayers can be improved if the bonding segments bond not only to the surface, but to each other. The trichlorosilyl group is a good example, because each silicon atom can react with the surface, to replace one chlorine atom, and with two neighboring silicon atoms, to replace the other two chlorine atoms. Often the reaction takes place in the presence of adventitious moisture, replacing two chlorines with one oxygen, resulting in an Si—O—Si bond and the release of two HCl molecules.

Monolayers may be assembled from mixtures of initiator compositions. In the discussion of initiator composition requirements above, the applicability of initiator compositions with more than one kind of initiating segment was disclosed. In many cases the synthesis of complicated initiator compositions with mixtures of initiating segments will not be necessary, and the mere mixing of different initiator compositions in a common solvent, each with a single initiating segment, in the deposition bath is sufficient. These mixtures may be combinations of initiator compositions with different cage structures; acyclic, cyclic, and/or cage structures; different heteroatoms and/or carbon; or permutations thereof. The initiator compositions may or may not be identical, aside from the initiating segment; other and more complex variations in the C and I segments of the initiator compositions may be employed as the application requires. For example, it may be desirable to use the "oily" chains mentioned previously as initiators, but to introduce texture to the surface by using a mixture of chain lengths.

In cases where the initiating segment is bulky, as mentioned previously, a mixture of initiator compositions may be required, the second set lacking the initiating segment and acting as a filler, as discussed by Maoz, Netzer, Gun and Sagiv, cited above. Although there is no theory at the present time to predict exactly how much filler will be necessary for a given initiating segment, the percent of the surface to be filled in can be estimated from the dimensions of the group I, which can be obtained from space-filling molecular models or from published crystal structure data. However, the filler fraction must be optimized experimentally following the procedures discussed in the article and in the references. The same requirement of experimental determination of coverage holds true for the target surface, because each monolayer/substrate interaction is unique. The substrates that have been used in published SAM studies were listed previously.

Another strategy for addressing the steric requirements of bulky groups is the B-I option, initiator compositions with no connecting segment, deposited onto SAMs serving as substrates, mentioned earlier. For example, a SAM of chains functionalized at the end exposed to the film-forming environment, such as those disclosed by Sagiv in his patent, and by Pomerantz et al in Thin Solid Films, vol. 132, p. 153 (1985), could be the substrate. An appropriate initiator composition could be made of an adamantyl bonded directly to a chain tailored for the specific funtionality at the exposed surface of the already assembled SAM. The result would be a SAM with as many chains bonded to exposed adamantyl groups as space allowed, with the rest of the chains effectively acting as filler.

Deposition of the film on the initiating film can be carried out by the conventional technology; e.g., for diamond film, plasma-enhanced chemical or physical vapor deposition, using microwaves, hot filaments, or a plasma torch as the energy source. Kamo et al, for example, have disclosed methods of diamond film deposition using microwave-enhanced plasmas in U.S. Pat. No. 4,434,188. Acording to this method, hydrogen gas is mixed with a hydrocarbon gas either before or after passing through a microwave nonelectrode discharge, and the mixture is introduced onto the surface of a substrate heated to a temperature of from 300° to 1300° C. Kirkpatrick has disclosed a method of diamond film deposition using hot filaments in U.S. Pat. No. 5,082, 359. In Example II, parameters for deposition conditions are given in a table.

In addition, lasers have been disclosed as suitable as energy sources for diamond CVD in U.S. Pat. Nos. 5,098, 737, 5,094,915, and 4,948,629, and for deposition from the liquid phase in U.S. patent application Ser. No. 451,699, Dec. 18, 1989, published under NTIS-PAT-APPL-7-451 699. In one example from the '629 patent, malonic acid vapor and hydrogen were passed over a silicon substrate at room temperature (25° C.), and irradiated with a lightly focused KrF laser beam for 1.5 hours. The resulting deposit was 5 mm×15 mm and 1µ thick. Reflectance Raman spectriscopy and Auger spectriscopy of the sample established it was diamond. Such methods are particularly suitable in conjunction with the present invention, because they allow the entire process to be carried out at low temperatures, and are therefore applicable to a wider range of substrate materials. Indeed, materials other than diamond can be processed at more moderate temperatures, for example with sol-gel techniques, and any of those processes that require an adhesive and/or initiating interlayer are suitable for use with the present invention.

Neither these citations nor the following examples are meant to be limiting, but are selected to impart a better understanding of how the invention may be practiced. All of the procedures in the following examples have been selected and transcribed, with modifications as necessary, from publications describing the preparation of either the product specified herein, or of a close analogue. In each case the citation is given.

EXAMPLE 1

Synthesis of Initiator Composition with I=1-Adamantanyl, C=Octadecyl, and B=Thiol or Trichlorosilyl Procedure 1 follows Fieser et al, *J. Med. Chem.*, 10, 517, (1967), Scheme III (p. 519), incorporated herein by reference.

Step A. A flask is charged with 1-bromoadamantane (30 g), available from Aldrich Chemical Co., and hexane (60 ml). The mixture is stirred magnetically in a Dry Ice-acetone bath at −75° C. and freshly pulverized $AlBr_3$ (15 g) of high quality is introduced (best results are obtained with hard yellow lumps supplied in a sealed ampoule). The weight of the flask with the three necks stoppered is recorded, and ethylene is bubbled in with stirring at −75° C. until the gain in weight is 4.2 g (15–30 min). Addition of ethylene is then stopped, but stirring is continued for 5 min longer. The mixture is transferred to a separatory funnel containing ice (50 g) and ether (25 ml), with use of hexane and ether for rinsing. On shaking, both layers become nearly colorless. The water layer is separated and extracted with ether, the combined extract is washed ($Na_2CO_3$ solution) and dried ($CaCl_2$), and the solvent is evaporated. The residue, about 35 g (occasionally solid, contains 2–5 g of adamantane), on vacuum distillation affords 26–28 g of material boiling at 90°–115° C. (0.2–0.5 mm) and solid at room temperature. This is dissolved in hot methanol (125–150 ml) and allowed to cool to room temperature and then to −5° C. for several hours. The product, 18–20 g, mp 68°–69° C. is satisfactory 1-(β-=bromoethyl)adamantane (1). More material (3–5 g) is obtained in a second crop after distillation and recrystallization; over-all yield 67%.

Step B: 2-Carbon Chain Extension. Sodium (2.5 g) is dissolved in absolute ethanol (50 ml, distilled over Mg) with stirring and protection from moisture, and redistilled malonic acid ester (15 ml) is added dropwise, followed by 1 (15 g). After stirring and refluxing for 5 h, most of the ethanol is distilled, a solution of KOH (20 g) in $H_2O$ (30 ml) is added, and the mixture is refluxed for 5 h. More ethanol is removed by distillation, and the mixture is cooled, acidified ($H_2SO_4$), and extracted with ether. The residue from evaporation of the ether is heated in an oil bath at 170°–180° C. for 1 h for decarboxylation, and a solution of the crude acid in dilute KOH is decolorized with Norit, precipitated, and crystallized from aqueous methanol to give 4-=(1-adamantyl)butyric acid (2) (11 g) , mp 100°–102° C.

Step C: Reduction and Bromination. A solution of 2 (3 g) in THF (50 ml) is stirred with ice cooling during gradual addition of $LiAlH_4$ (0.7 g). The mixture is then stirred and refluxed for 5 h, cooled, and 5% NaOH solution is added to destroy excess $LiAlH_4$. The white precipitate is filtered off, the filtrate is concentrated to 50 ml, and $H_2O$ is added to precipitate the alcohol (3), which may be an oil. The alcohol is refluxed with 48% HBr (8 g) and $H_2SO_4$ for 4 h. The mixture is extracted with hexane, and the extract is washed with $Na_2CO_3$, dried, and evaporated. Distillation of the residue yields the bromide, bp 118° C. (0.18 mm).

Steps B and C are repeated until the chain reaches 18 carbons in length, the 18-(1-adamantyl) octadecanoic acid is reduced with $LiAlH_4$, and the resulting 18-(1-adamantyl) octadecanol (4) is either treated as in Procedure 4 below, or converted to the Grignard reagent (5) as in Procedure 2, Step A, and then treated as in Procedure 5 below.

Procedure 2 may begin with Step C below, using commercially available 6, e.g., from Aldrich Chemical Co., if preferred.

Step A, formation of the Grignard reagent, follows Yurchenko and Fedorenko, *Zh. Org. Khim.*, 23, 970 (Engl. trans. 875) (1987), incorporated herein by reference. One outer neck of a dry 250-ml 3-necked round-bottomed flask containing a magnetic stirring bar and magnesium turnings (3.04 g, 125 mmol) is fitted with a rubber septum, the other outer neck with an ice-jacketed pressure-equalizing dropping funnel and the center neck with a reflux condenser containing a gas adapter connected to a source of dry argon, with which the system is flushed for 15 min. Diethyl ether (50 ml) , which has been freshly distilled over diphenylketylsodium in a stream of argon, and 1,2-dibromoethane (0.1 ml) are added. The reaction mixture is boiled for 15 min, and 1-bromoadamantane (2.8 g) is added with stirring. Samples are taken at 15-min intervals and analyzed by gas chromatography (1200×3 mm glass column, 5 % silicone SP-1000 on Inerton-N-super, helium, 60 ml/min, inlet temperature 250° C., detector temperature 230° C., programmed column temperature 60°–150° C., 10 deg/min, 150°–220° C., 20 deg/min, isothermal interval of 6 min at 220° C.). The chromatographic data are treated quantitatively by means of an HP-3380A integrator, and the detector is calibrated by normalization with 3,7-dimethylenebicyclo(3.3.1)nonane (770-=14-9) as an internal standard. The mixture is stirred and boiled until all the 1-bromoadamantane disappears, after which it is cooled to 20° C. and filtered in an atmosphere of argon. The Grignard reagent is obtained as a solution (50 ml) with a concentration of 0.126M (yield 48%). The authors cite their care in protecting the reaction from oxygen for the lack of difficulty with the synthesis encountered by Molle et al, *J. Org. Chem.*, 47, 4120 (1982), incorporated herein by reference, whose modification may be followed as an alternative method. No source is given for 3,7-dimethylenebicyclo(3.3.1)nonane, which is not available commercially, and it may have been a product of that laboratory conveniently at hand. It is likely that an equally useful but commercially available standard can be found. If the bicyclononane standard is desired, it can be synthesized from adamantane following Mink et al, *J. Am. Chem. Soc.*, 113, 2065 (1991), incorporated herein by reference. A liquid chromatographic method of separation has been published for a number of adamantane and diamantane derivatives, by Vodicka, *J. Chromatog.*, 270, 199 (1983), and references therein, particularly 4, 5, and 6, all incorporated herein by reference.

Step B: Chain Formation or Extension. The chain is formed or extended by succesive units of two or three carbons following the procedures of Sagiv, U.S. Pat. No. 4,539,061, col 7, lines 4–14, steps C, A, and B (corresponding to A, B, and C herein, respectively), incorporated herein by reference. Ethylene oxide (3.0 ml, 2.6 g, 60 mmol) or trimethylene oxide (3.5 g, 60 mmol) in ether (20 ml) is dripped, with ice cooling, into a 10-fold preparation of the Grignard reagent above, and the reaction mixture is allowed to stir for 24 h. The mixture is washed with water, the solvent stripped off, and the residue distilled under reduced pressure, yielding 2-(1-adamantyl)ethanol (6), or 3-(1-=adamantyl)propanol (7).

Step C. Conversion of 6 or 7 to the chloride follows the method of Hooz and Gilani, *Can. J. Chem.*, 46, 86 (1968), incorporated herein by reference. The conversion of the former will be described here. To a magnetically stirred solution of 6 (10.0 mmol) in carbon tetrachloride (20 ml) is added tri-n-=octylphosphine (10.5 mmol). An exothermic reaction ensues. (In larger scale runs it is recommended that the reaction be moderated by a cooling bath. ) Approximately 5 min after complete addition of the phosphine an aliquot is analyzed by gas liquid partition chromatol (5 ft×¼ in. FFAP on Chromosorb W column operated at 140° C. helium flow 55 ml/min). No 5 should be present, but a new peak should appear, which should be 1(2-chloroethyl)adamantane (8). The yield is determined by g.l.p c. By operating at a column temperature of 50° C. and helium flow of 25 ml/min, the peaks due to carbon tetrachloride and chloroform can be resolved. Chloroform and carbon tetrachloride are distilled through a 25 cm Vigreaux column and the residue is chromatographed on BDH alumina. The pentane eluate is concentrated and distilled to give pure 8. Steps A, B, and C are repeated until the chain has reached 18 carbons in length. The resulting 18(1-adamantyl)octadecanol (4) is either treated as in Procedure 4 below, or converted to the magnesium halide (5) and treated as in Procedure 5 below.

Procedure 3, Step A, for the preparation of methyl 16-=iodohexadecanoate (9), follows Takahashi et al, *Appl. Radiat. Isot.*, 42, 801 (1991), incorporated herein by reference. To a mixture of phosphoric acid, (840 mg, 8.6 mmol) and phosphorus pentoxide (ca 450 mg), potassium iodide (868 mg, 5.2 mmol) and 16-hydroxyhexadecanoic acid (353 mg, 1.3 mmol), available from Aldrich Chemical Co., is added at room temperature and the mixture is heated at 110° C. for 3.5 h. The mixture is cooled to room temperature, and water (25 ml) and ether (120 ml) are added. The ether layer is separated, decolorized by shaking with 10% sodium thiosulfate solution (100 ml), washed with saturated NaCl aqueous solution (200 ml) , and evaporated to give crude 16-=iodohexadecanoic acid (38 mg). To a suspension of the sample in absolute MeOH (30 ml) thionyl chloride (6.5 ml) is added dropwise at 0° C. The mixture is stirred at 0° C. for 15 min and then refluxed for 30 min. After removal of the solvent, the residue is purified by preparative TLC (hexane/$CH_2Cl_2$=7/3) to give 9 (26 mg). The procedure is performed on a 1-mole scale to provide enough material for Step C below.

Step B. The 2-(1-adamantanyl)ethylmagnesium bromide is prepared following Procedure 2, Steps A and B, except that in A the scale of preparation is increased 8-fold, and THF is used as the solvent.

Step C. Coupling via the lithium methyl cuprate follows the procedure of Bergbreiter and Whitesides, *J. Org, Chem.*, 40, 779 (1975), incorporated herein by reference. Cuprous iodide (9.5 g, 50 mmol) is purified following the method of Keller and Wycoff, *Inorg. Synth.*, 2, 1 (1946), incorporated herein by reference, by grinding the material (10 g) in a mortar with enough 1N sulfuric acid to form a paste, stirring the paste into a large quantity of dilute sulfuric acid, and allowing the solid to settle. The copper(I) iodide is then washed four or five times with 20 to 25 ml of glacial acetic acid. During this washing process the suction should be adjusted so that the wash liquid is sucked through rather slowly. When only a thin film of liquid covers the solid, the next portion of glacial acetic acid is added. The walls of the funnel should be washed each time with the washing liquid. The washing with glacial acetic acid is followed by three 30-ml washings with absolute alcohol and six 15-ml washings with anhydrous ether in exactly the same way. After the last portion of ether has been removed fairly completely by applying suction for about 30 seconds, the white solid (with filter paper removed) is transferred quickly to a previously dried watch glass and placed in an oven (75° to 100° C.) for 20 to 25 minutes. The sample should be preserved in an airtight bottle.

Purified cuprous iodide (9.5 g, 50 mmol) is placed in a flame-dried, 1-l, round-bottomed flask equipped as previously described in Procedure 2, Step A, except for the use of a mechanical instead of a magnetic stirrer, and pre-purified nitrogen instead of argon. Addition of THF (200 ml), distilled from disodium benzophenone dianion, gives a suspension which is cooled to −78° C. A 2.2M ether solution of methyllithium (22.5 ml, 50 mmol) is added to this suspension with a syringe. The reaction mixture is stirred for 1 h at −78° C. The resulting light yellow suspension is allowed to warm gradually to 0° C. with stirring. The resulting suspension of methylcopper is cooled to −78° C. and the Grignard solution prepared in Step B is added with a syringe. The reaction mixture is allowed to stir at −78° C. for another hour and warmed until a solution forms. The resulting purple solution is immediately cooled to −78° C. during which time some white solid forms. The sample of 9 (60 mmol) in THF is added with a syringe. The resulting suspension is stirred for 1 h at −78° C., after which it is allowed to come to room temperature. The reaction mixture is stirred at room temperature for 2 h before it is quenched by pouring into a saturated aqueous ammonium chloride solution. The ethereal solution is separated and the aqueous is extracted with with three 250-ml portions of ether. The combined organic fractions are washed once with 200 ml of saturated sodium chloride and dried ($Na_2SO_4$). The product, methyl 18-(1-=admantanyl)octadecanoate (10) is isolated by removing the ether with a rotary evaporator and recrystallizing the residue.

Step D. Reduction to the alcohol follows the procedure of Nystrom and Brown, *J. Am. Chem. Soc.*, 69, 1197 (1947), incorporated herein by reference. The sample of 10 in ether (50 ml) is placed in the flask of a system like that described in Procedure 2, Step A, with a stopper in place of the dropping funnel. The stopper is removed briefly to allow introduction of an equimolar amount of $LiAlH_4$ powder, available from Aldrich Chemical Co. Ten minutes after addition and with continued stirring, water is added dropwise and cautiously, cooling the flask if during the exothermic decomposition of excess hydride the refluxing becomes too vigorous. The mixture is then poured into ice water (50 ml), and to this is added 10% sulfuric acid (200 ml). After separation of the ether layer, the aqueous layer is extracted with two further 50-ml portions of ether. The ether is evaporated, and the residue distilled under reduced pressure. The product, 18-(1-adamantanyl)octadecanol (4), is either treated as in Procedure 4 below, or converted to the Grignard reagent (5) as in Procedure 2, Step A, and then treated as in Procedure 5 below.

Procedure 4. Thiol Bonding Segment. The procedure follows that described by Bain and Whitesides, *J. Am. Chem. Soc.*, 111, 321 (1989), incorporated herein by reference. Sodium metal (10.3 mg-atom), thiolacetic acid (10.3 mmol), and the alkyl bromide (9.3 mmol) are dissolved in 100 ml of degassed ethanol and refluxed for 3 h under argon. After cooling to room temperature, 5 ml of conc. HCl is added, and the reaction mixture is refluxed overnight. If recrystallization of the product, 18-(1-=adamantanyl)octadecanethiol (11) from ethanol is unsuccessful, it may be purified by flash chromatography using hexanes as eluent.

Procedure 5. Trichlorosilyl Bonding Segment. The Grignard reagent, e.g. 5, is converted to the trichlorosilyl derivative, following the procedure described by Sagiv in U.S. Pat. No. 4,539,061 col 7, lines 4–9, 14–20, step D, by adding the reagent solution dropwise to a magnetically stirred solution of tetrachlorosilane (excess) in benzene, in a system identical to that for the Grignard reagent, but with a stopper in place of the addition funnel. The mixture is allowed to stir for 2 h, refluxed for two more hours, and the solid separated under argon by centrifugation. The final product, 18-(1-adamantanyl)octadec=yl trichlorosilane (12), is vacuum-distilled in a rotating-ball tube oven, and stored under nitrogen.

EXAMPLE 2

Synthesis of Initiator Composition with I=2-Adamantanyl, C=Octadecyl, and B=Thiol or Trichlorosilyl Procedure 2, Step A of Example 1 is used for the generation of the 2-adamantyl Grignard reagent from 2-bromoadamantane, available from Aldrich Chemical Co., and Step B for the first two carbons of the chain. The rest of the synthesis can follow any of the procedures of Example 1.

EXAMPLE 3

Synthesis of Initiator Composition with I=1-Diamantanyl, C=Octadecyl, and B=Thiol or Trichlorosilyl Procedure 6. The synthesis of diamantane follows Gund et al, *Org. Syn.*, 53, 30 (1973), incorporated herein by reference.

Step A. Binor-S (13). Cobalt bromide-triphenylphosphine catalyst is prepared quantitatively by refluxing a solution of anhydrous cobalt dibromide (10 g, 0.046 mol) and triphenyl phosphine (24.4 g, 0.092 mmol), both available from Aldrich Chemical Co., in benzene (200 ml) until the color changes, and then filtering the blue-green solid that precipitates on cooling. A 2-l, 3-necked flask equipped with Teflon sleeves, a thermometer, a condenser, a dropping funnel, and a mechanical stirrer is flushed with nitrogen and charged with freshly distilled norbornadiene (200 g, 2.18 mol), dry toluene (400 ml), and cobalt bromide-triphenylphosphine catalyst (7.8 g). While stirring at room temperature, boron trifluoride etherate cocatalyst (2.1 ml), available from Aldrich Chemical Co., is added dropwise. The mixture is then heated slowly to 105° C. when the heating mantle is lowered. The ensuing exothermic reaction maintains the temperature at 105°–110° C. for 15 minutes. When the temperature begins to fall, the mantle is raised, the mixture is brought to the reflux temperature, and stirring and refluxing are continued for 12 hours. The cooled mixture is diluted with dichloromethane (650 ml), transferred to a separatory funnel, and washed with three 650-ml portions of water. The organic phase is dried over anhydrous magnesium sulfate, and the solvents are evaporated at reduced pressure. The residual crude material, 185–203 g, is distilled at 106°–107° C. (1.5 mm) to give 165–170 g (82–85%) of 13 which, on cooling, solidifies to a white solid, mp 59°–63° C.

Step B. Tetrahydro-Binor-S (14). Binor-S (135.0 g, 0.73 mol) is dissolved in glacial acetic acid (670 ml) containing concentrated hydrochloric acid (5.7 ml). To this solution is added platinum oxide catalyst (1.0 g). The reaction mixture is hydrogenated at 200 psi hydrogen pressure and 70° C. for 3 hours using a 1200-ml glass-lined autoclave. After cooling to room temperature, the catalyst is removed by suction filtration, and water is added to the filtrate until two layers form. About 1.5 l of water is required. The bottom layer, containing only 14, is removed, and the top layer, consisting of a mixture of acetic acid and water, is extracted with 400 ml and then two 100-ml portions of dichloromethane. The combined dichloromethane-14 layers are washed twice with 100 ml of water, dried over anhydrous magnesium sulfate, and then evaporated under reduced pressure. The residual 14 is purified by distillation under reduced pressure, bp 105°–110° C. (1.5 mm), to give 125–130 g (90– 94%) of a colorless liquid.

Step C. Diamantane. A 500-ml, three-necked flask equipped with a reflux condenser, a drying tube, a magnetic stirring bar, and a dropping funnel, is charged with fresh aluminum bromide (28 g, 0.1 mol) and cyclohexane (100 ml). The apparatus is flushed with hydrogen bromide gas. When the aluminum bromide has dissolved, 14 (100 g, 0.53 mol) is added dropwise to the rapidly stirred solution, and the reaction mixture refluxes for a short time without external heat. The course of the reaction is monitored by g.l.c. until no more starting material remains. Retention times on a 10% OV101 GCQ column, 100/120 at 200° are diamantane, 6.2 minutes; 14, 7.6 minutes; Binor-S, 11.5 minutes. Alternatively, diamantane elutes before 14 from a Carbowax 20M or 1500 column at 180° C. Occasionally, an additional 5-g portion of aluminum bromide and application of external heat are needed to complete the reaction. The total reaction time is about 2–3 hours. The hot cyclohexane layer is carefully decanted, and the aluminum bromide layer is extracted with five 200-ml portions of hot cyclohexane. Ether (400 ml) is added to the cooled cyclohexane extracts, and the combined solvent fractions are washed with two 100-ml portions of water and dried over anhydrous magnesium sulfate. Evaporation of the solvent leaves a semi-solid residue that is partially dissolved in about 100 ml of pentane. The undissolved white solid, diamantane, is collected by suction filtration. Additional diamantane is obtained by concentrating the pentane solution to a small volume and collecting the solid that precipitates. The total amount of diamantane obtained, after drying, is 60–62 g (60–62%), mp 240°–241° C. (closed tube). This product is sufficiently pure for most purposes, but it may be purified further by recrystallization from pentane to give white crystals, mp 244.0°–245.4° C.

Procedure 7, Step A. The synthesis of 1-diamantanecarboxylic acid (15) follows Gund et al, *J. Org. Chem.*, 39, 2987 (1974), incorporated herein by reference. A flask equipped with stirrer, thermometer, dropping funnel, and gas outlet tube is charged with 97.2% sulfuric acid (130 ml), carbon tetrachloride (50 ml) and diamantane (9.4 g, 0.050 mol) The mixture is cooled to 17°–19° C. and 98–100% formic acid (0.5 ml) is added. Then a solution of t=-butyl alcohol in 98–100% formic acid (28 ml) is added dropwise (about 2 h). The reaction mixture is stirred for an additional 30 minutes, and then poured onto 350 g of crushed ice. The layers are separated, and the upper, acid layer is extracted with three 100-ml portions of $CCl_4$. The combined $CCl_4$ layers are shaken with 15N ammonium hydroxide (55 ml), and the precipitated ammonium diamantanecarboxylate is collected, washed with cold acetone (20 ml) and suspended in about 100 ml of water. The suspension is made strongly acidic with concentrated HCl and extracted with chloroform. The organic layer is separated, dried over $MgSO_4$, and evaporated. The residue (3.70 g, 0.0123 mol) of crude 15 (25% yield) is recrystallized from methanol-water. From the carbon tetrachloride solution (mother liquor) of ammonium salt, 4.0 g of unreacted diamantane can be isolated. The acid can be purified for analysis by recrystallization from benzene; white, fluffy crystals, mp 201.5°–202.2° C. are obtained; IR (Nujol oil) 1695, 1410, 1275, 1250, 1230(w), 1100, 1075, 1055(d), 1040(w), 935(b), and 710 $cm^{-1}$.

Step B. Reduction of 15 to 1-diamantanemethanol (16) follows Marshall and Canada, *J. Org. Chem.*, 45, 3123 (1980), citing the procedure for the analogous 1-adamantanecarboxylic acid in Barfield et al, *J. Am. Chem. Soc.*, 98, 6253 (1976), both incorporated herein by reference. To a stirring slurry of lithium aluminum hydride (0.08 g) in anhydrous ether (5 ml) cooled to 0° is added 15 (0.380 g). The mixture is allowed to stir at room temperature for three days, cooled to 0° C., and water (1 ml) is added. After 1 h stirring, the mixture is filtered to give a quantitative yield of product, which is chromatographed (F-20 Alcoa alumina, n-pentane) to give 16 (0.137 g, 38%); mp 206–209 (sealed); IR 3400, 1210; $^1$H NMR $\delta(CDCl_3)$ 3.17(s, 2H), 2.85(s, 1H) 2.12(br, 2H), 1.90(br, 2H), 1.5–1.2 (br, 13H), 0.92 (br, 2H).

Step C. Homologation by one carbon atom continues via the Barfield procedure. A stirring slurry of 16 (0.91 g, 4.2 mmol), potassium cyanide (0.2 g, 3.0 mmol) and dimethyl sulfoxide (10 ml) is heated at reflux for 2 h, cooled, mixed with water (20 ml), and extracted with ether. The ethereal extracts are dried (magnesium sulfate), and concentrated in vacuo to give 1-=cyanomethyldiamantane (17, 93% ).

Alternatively, reduction and homologation may be carried out following Fieser et al, *J. Med. Chem.*, 10, 517, (1967), Scheme III (p. 519), previously cited for 2-carbon homologations of the analogous adamantyl derivatives in Example 1, Procedure 1. A mixture of 15 (18 g), free of mineral acid, and $SOCl_2$ (20 g) is warmed in an oil bath to 50°–60° C. and kept at that temperature for 1 h. Excess reagent is distilled at the pressure of the water pump, benzene (20 ml) is added and distilled (water pump), and vacuum distillation of the residue gives 19 g of a white solid, mp 54°–56° C. A solution of 10 g in THF (120 ml) is stirred with ice cooling during gradual addition of powdered $LiAlH_4$ (2 g). The mixture is then stirred and refluxed for 5 h, cooled, and 5% NaOH solution is added dropwise to destroy excess $LiAlH_4$. The white precipitate is filtered off, the filtrate is concentrated to 50 ml, and $H_2O$ is added to precipitate the alcohol 16. The product (8.1 g, 97.5%), melts at 113°–115° C. and is satisfactory for esterification. Recrystallization from aqueous methanol raises the melting point to 115°–116° C.

Treatment of 16 with p-toluenesulfonyl chloride in pyridine follows the procedure for the analogous adamantyl derivative of Stetter et al, *Ber.*, 92, 1629 (1959), incorporated herein by reference. A sample of 16 (12.6 g) dissolved in anhydrous pyridine (21 ml) is added gradually to p-toluenesulfonyl chloride with stirring and cooling in an ice bath. After 20 h reaction at room temperature the reaction mixture is added with cooling to 15% hydrochloric acid (100 ml). If the initial precipitated product is an oil, it may be solidified by trituration with a glass rod and recrystallized from ethanol to yield about 90% product. Returning to the Fieser procedure, a mixture of the tosylate (16.6 g), KCN 98 g) and DMF (60 ml) is stirred in an oil bath at 120° C. for 1 day. The reaction mixture is poured onto ice, and the solid precipitate (17, 95%) is collected and dried.

Step D. Hydrolysis of 17 follows Fieser. A mixture of the cyanomethyl compound (13 g), KOH (15 g), and ethylene glycol (50 ml) is stirred and heated at 150° C. for 30 h. The solution is poured into hot $H_2O$ (300 ml), 1 g of Norit is added, and the hot mixture is filtered. Acidification of the filtrate precipitates a solid, which on crystallization from methanol affords 1-=diamantaneacetic acid (18). After 18 has been reduced and brominated by the method of Procedure 1, Step C, any of the procedures of Example 1 may be followed. The resulting 18-(1-diamantanyl)octadecanol (19) is either treated as in Example 1, Procedure 4; or converted to the Grignard reagent (20) as in Procedure 2, Step A, and then treated as in Example 1, Procedure 5.

Procedure 8, Step A. The synthesis of 1-bromodiamantane (21) follows Gund et al, *J. Org. Chem.*, 39, 2995 (1974), incorporated herein by reference. Bromine (10 ml) is added dropwise to diamantane (2.0 g, 0.011 mol) with stirring, and cooling in an ice bath. After addition is completed, the ice bath is removed, and the reaction mixture is stirred about two hours at room temperature. The bromine solution is diluted with $CCl_4$ or $CHCl_3$ and poured onto ice. Excess bromine is decomposed by addition of solid sodium bisulfite in small portions, and stirring until the bromine color disappears and the solution turns light yellow or colorless. The carbon tetrachloride (or chloroform) solution is then washed with water, dried over $MgSO_4$, and evaporated under reduced pressure. The semi-solid which is obtained is sublimed and recrystallized from pentane; 2.4 g (80%) of white, crystalline 21, mp 217.5°–220° C. is obtained Further recrystallization from hexane gives white crystals, mp 222°–224° C. IR(cm$^{-1}$): 1340, 1280, 1070, 1050, 970, 880, 800, 740, 710.

Step B. The synthesis of 1-diamantyllithium follows Molle et al, *J. Org. Chem.*, 48, 2975 (1983), incorporated herein by reference. Lithium (98 g) and sodium (2 g) are place in a nickel crucible with a three-holed lid—a hole for an argon inlet, a hole for a thermometer, and a hole for a stirrer. Under high argon flushing, the crucible is slowly heated until the medium is completely liquified (ca 190° C.). After homogenization, the medium is then quickly poured into a crystallizing dish containing Vaseline oil dried over sodium by heating at 160° for 1 h. This yields irregularly shaped morsels, which, before use, are made into wires by a sodium press with a pot warmed by a heating wire.

Step C. Pentane (25 ml) and finely cut lithium wire with 2% sodium (280 mmol) are added under an argon stream to a three-necked Morton flask containing 15 g of coarsely crushed glass and equipped with a carbon dioxide ice condenser and a Hershberg stirrer. The solution is vigorously stirred for 20 min under pentane reflux. Then, while continuing vigorous stirring under a slight argon stream, 21 (20 mmol) in pentane (75 ml) is slowly added. The presence of crushed glass, together with vigorous stirring, allows the metal surface to be scoured while generating lithium sand, and, later, enables removal of the lithium chloride adsorbed at the metal surface. After the disappearance of 21, a sample can be subjected to deuterolysis and analyzed by GC (Carbowax 20M or SE-30 column) to determine the organolithium concentration.

Alternatively, the reaction can be run in the same equipment, but introducing lithium powder (0.024 mol) and ether (10 ml) to the flask at −50° C. After 10 min of vigorous stirring, the 1-=bromodiamantane (0.004 mol) in dry ether (10 ml) is added over 30 min, with vigorous stirring, and 15 min after addition is complete, the reaction may be analyzed as before.

The synthesis of the SAM initiator composition continues with the method of Example 1, Procedure 2, Step B. If Step B is addition of ethylene oxide, rather than trimethylene oxide, and conversion to the bromide, then any of the procedures of Example 1 may be followed subsequently.

EXAMPLE 4

Synthesis of Initiator Composition with I=3-Diamantanyl, C=Octadecyl, and B=Thiol or Trichlorosilyl Procedure 9, Step A. The synthesis of 3-diamantanol (22) from diamantane follows Gund et al, *J. Org. Chem.*, 39, 2987 (1974), incorporated herein by reference. To diamantane (2 g), prepared as in Example 3, Procedure 6, is added 96.6% sulfuric acid (100 ml); the reaction mixture is then heated for four hours at 75° C. with vigorous stirring. Stirring is continued at room temperature for one additional hour. The black reaction mixture is poured over ice and steam distilled. The steam distillate is extracted with ether, and the combined ether extracts are washed with water and dried over $MgSO_4$. Evaporation of the solvent leaves 1.4 g (70% yield) of crude diamantanone. The product may be further purified by chromatography on alumina. The second fraction, eluted with benzene-ether (1:1) contains pure diamantanone (0.8 g, 37%). Recrystallization from petroleum ether gives white crystals, mp 249°–250° C.; IR (Nujol oil) 1745, 1720, 1295, 1245, 1045 cm$^{-1}$.

Step B. A solution containing diamantanone (0.55 g, 2.7 mmol) in anhydrous ethyl ether (15 ml) is added within ½ hour to anydrous diethyl ether (30 ml) containing lithium aluminum hydride (0.093 g, 2.4 mmol). After refluxing for 1½ hours, and stirring at room temperature for an additional ½ hour, the reaction mixture is cooled in an ice bath, and 10% sulfuric acid (7 ml) is added slowly. The reaction mixture is worked up in the usual way, and evaporation of solvent leaves a white solid (0.4 g, 73% yield). Recrystallization from petroleum ether gives white fluffy crystals, mp 256°–257° C.; IR ($CCl_4$) 3150 (OH), 2950, 1065 cm$^{-1}$.

Step C. Synthesis of 3-diamantaneacetic acid (23) follows the procedure of Vodicka et al, Collect. Czech. *Chem. Commun.*, 51, 1086 (1986) incorporated herein by reference. A solution of 22 (0.25 g) in chloroethylene (12.8 g) is added dropwise over the course of 1 h with cooling and stirring to 96.6% sulfuric acid (50 g), precooled to 0° C. After stirring for 30 min, the mixture is poured on ice and extracted three times with ether. The ethereal extract is washed with 5% aqueous potassium hydroxide, water, and dried over sodium sulfate. The alkaline washings are acidified with hydrochloric acid and extracted three times with ether. The combined extracts are washed with water, dried, and the solvent is evaporated. The residue (0.20 g) is dissolved in methanol, esterified with diazomethane, and separated by gas-liquid chromatography on a 1200 mm column, internal diameter 3 mm, packed with 3% XF 1150 on Chromaton N-AW-DMCS (0.15–0.18 mm), temperature 180° C. Methyl 4- and 3-diamantylacetates (Me-24, Me-23) are the first and second products eluting (7.2 and 48.9% of the acid fraction, the latter in 35% yield based on adamantanol).

The synthesis of the SAM initiator composition continues with the method of Example 1, Procedure 2, Step B. If Step B is addition of ethylene oxide, rather than trimethylene oxide, and conversion to the bromide, then any of the procedures of Example 1 may be followed subsequently.

EXAMPLE 5

Synthesis of Initiator Composition with I=4-Adamantanyl, C=Octadecyl, and B=Thiol or Trichlorosilyl Procedure 10, Step A. The synthesis of 4-bromodiamantane (25) follows Gund et al, *J. Org. Chem.*, 39, 2995 (1974), incorporated herein by reference. Freshly sublimed aluminum bromide (0.1 g) is added to a mixture of diamantane (Example 4, Procedure 7, 2.0 g, 0.011 mol) and t-butyl bromide (2.0 g, 0.015 mol) in anhydrous cyclohexane (10 ml) at 0° C. After stirring overnight at the same temperature, the reaction mixture is added to ice and extracted with 3×100 ml of hexane. The hexane layers are combined, washed with water, and dried over $MgSO_4$. Evaporation of solid leaves 3.0 g of semi-solid material which is 98% a mixture of monobromodiamantanes 21 and 25. The rest is comprised of 1,4-, 1,6-, and 4,9-dibromides. The 1- and 4-bromodiamantanes 21 and 25 are separable by column chromatography on Woelm neutral alumina or silica gel. The first to elute with hexane is 21; 25 follows. Recrystallization of 25 from hexane yields white crystals, mp 127°–128.2° C.

Step B. The synthesis of 4-diamantanol follows Gund et al, *J. Org. Chem.*, 39, 2987 (1974), incorporated herein by reference. A sample of the mixture (1.0 g) is hydrolyzed by refluxing overnight in a solution of 10% $K_2CO_3$ (100 ml), acetone (50 ml), and $AgNO_3$ (0.5 g). The reaction mixture is extracted with 3×100 ml of ether. The collected extracts are washed with water until neutral and dried over $Na_2SO_4$. The solvent is evaporated leaving white crystalline material (0.60 g, 78% yield); glc on a 1.5 m×3 mm 5% DC 710 column at 195° C. should indicate two peaks of retention time 4.0 and 4.5 min corresponding to 1-diamantanol (26, 41%) and 4-diamantanol (27, 59%). Separation of the two alcohols is achieved by chromatography on alumina; 26 elutes first with benzene ether 1:1, and 27 next. The 27 is recrystallized from acetone to give white crystals, mp 204°–206°.

Step C. The synthesis of 4-diamantaneacetic acid (24) follows Example 4, Procedure 9, Step C, except that the reagents are chloroethylene (4.5 g), 27 (0.10 g), and $H_2SO_4$ (20 g). Me-24 is 50.7% of the acid fraction, 50% yield based on adamantanol).

The synthesis of the SAM initiator composition continues with the method of Example 1, Procedure 2, Step B. If Step B is addition of ethylene oxide, rather than trimethylene oxide, and conversion to the bromide, then any of the procedures of Example 1 may be followed subsequently.

EXAMPLE 6

Synthesis of Initiator Composition with I=Cubyl, C=Octadecyl, and B=Thiol or Trichlorosilyl Procedure 11. Synthesis of Cubanecarboxylic Acid.

Step A. The synthesis of 2,4-dibromo-3a,4,7,7a-tetrahydro-=4,7-methanoinden-1,8-dione (32846-64-3) (28), endo-2,4-dibromo=dicyclopentadiene-1,8-dione 8 ethylene ketal (25834-51-9) (29), 5,9-dibromopentacyclo($5.3.0.0^{2,5}.0^{3,9}.0^{4,8}$)deca-6,10-dione 6 eth=ylene ketal (25867-84-9) (30), and 1-bromopentacyclo($4.3.0.=0^{2,5}.0^{3,8}.0^{4,7}$)nonan-9-one-4-carboxylic acid ethylene ketal (25867=-86-1) (31) was developed by Eaton and Cole, *J. Am. Chem. Soc.*, 86, 3157 (1964), incorporated herein by reference. It was reinvestigaed by Luh and Stock, *J. Org. Chem.*, 37, 338 (1972), incorporated herein by reference, because of difficulty with some steps, reported by Chapman, Key and Toyne, *J. Org. Chem.*, 35, 3860 (1970). The latter procedure may be followed in the case of the present invention, if necessary, although Luh and Stock found no difficulty with the original procedure.

The 2-cyclopentenone starting material (50 g. 0.61 mol), available from Aldrich Chemical Co., is added to a slurry of N-=bromosuccinimide (240 g, 1.45 mol) in carbon tetrachloride (700 ml). The reaction mixture is heated to reflux, stirred vigorously, and illuminated with a General Electric sun lamp to start the reaction. After the initial exotherm subsides, additional 2-cyclopentenone (50 g) is added, and the solution is refluxed for 3 hr. The reaction mixture is cooled, filtered, and concentrated in vacuo at room temperature. The residue is dissolved in a saturated ether solution (1 l) of lithium bromide vacuum-dried overnight at 100° C. The solution is cooled to −30° C.

Bromine is added dropwise at a rate sufficient to balance maintainance and control of the reaction, while the cooling bath is maintained at −30° to −35° C. When the reaction is complete, methylene chloride (750 ml) is added slowly, while the temperature is maintained at −25° to −30° C. Triethylamine (228 g, 2.26 mol) is then added dropwise over 2.5 hr, while the temperature is maintained at −20° to −30° C. for the first 90 min, and allowed to rise to −10° C. over the last hour. Further methylene chloride (~250 ml) is added to aid stirring. When the addition is complete, water (1 l) is added. The mixture is filtered and the liquid phases separated. The aqueous layer is extracted with methylene chloride, and the filter cake is washed with hot methylene chloride six times. The methylene chloride portions are combined, washed twice with each of hydrochloric acid (6M, 300 ml), and brine (300 ml). The organic layer is separated, dried over magnesium sulfate, filtered, and the solvent removed in vacuo, yielding about 42 g 28. The purified product is obtained by recrystallization from ethyl acetate, mp 155°–155.5° C. A second batch (about 21 g) can be obtained by refrigerating the mother liquor, but care should be taken to protect the skin from a reported irritant in the solution. Overall yield is 33%.

The dimer 28 (5 g, 15.7 mmole) is dissolved in a mixture of benzene (300 ml), ethylene glycol (13.6 g, 22 mmole), and p-=toluenesulfonic acid (55.5 g, 30 mmole), in a 1-l round-bottomed flask containing a magnetic stirring bar and fitted with a reflux condenser. After refluxing overnight, the 1-carbonyl group is selectively regenerated by the dropwise addition of concentrated aqueous hydrochloric acid (30 ml) to yield the 1-keto-8-ethylene ketal. The reaction mixture is washed with three 100-ml portions of water, dried over magnesium sulfate, and the solvent removed by rotary evaporation. Recrystallization from ether yields 85% 29 with mp 172°–173° C.; $\lambda_{max}$ ($CH_2Cl_2$) 5.78 and 6.28μ.

The ketal 29 (5 g, 15 mmol) is dissolved in benzene (150 ml), and the mixture transferred to a Pyrex irradiation cell. The solution is irradiated with a Hanovia 450-W mercury lamp for 90 min. The solvent is removed in vacuo, and the solid recrystallized from methylene chloride-hexane to yield 95% 30, mp 148°–150° C.; $\lambda_{max}$ ($CH_2Cl_2$) 5.53 (sh), 5.61, and 5.63 (sh) μ.

The bis-homocubane 30 is dissolved in hot, aqueous 10% KOH in an Erlenmeyer flask with stirring. The mixture is allowed to cool and washed with three portions of methylene chloride, which are then combined, dried, and stripped of solvent. The crude solid is recrystallized from methylene chloride-hexane, to yield 95% homocubylcarboxylic acid ethylene ketal (31), mp 187°–189° C.; $\lambda_{max}$ ($CH_2Cl_2$) 5.70 and 5.79μ; proton NMR ($CDCl_3$, ppm τ): −1.1(1H, s), +6.0(4H, m), 6.3(5H, m), and 7.2(1H, m).

Step B. Decarboxylation of the homocubylcarboxylic acid derivative 31 to 1-bromopentacyclo($4.3.0.0^{2,5}.0^{3,8}.0^{4,7}$)nonan-9-one ethylene acetal (56289-81-7) (32) follows Della and Tsanaktsidis, *Aust. J. Chem.*, 39, 2061 (1986), incorporated herein by reference. The acid (174 mg, 174 mmol, 1 eq) and thionyl chloride (2–3 eq) is heated under reflux for 2 hr. The mixture is allowed to cool and excess thionyl chloride is removed under vacuum. The sodium salt of N-hydroxypyridine-2(1H)-thione (2-mercaptopyridine N-oxide, sodium salt, available from Aldrich Chemical Co.; 1.1–1.2 eq), t-butyl mercaptan (2.5 eq), 4-=dimethylaminopyridine (2–4 mg) and anhydrous benzene (15 ml/g) are placed in the flask of a system like that described for the Grignard reagent in Example 1, and a solution of the acid chloride (1 eq) in anhydrous benzene is place in the dropping funnel. Nitrogen is bubbled through the mixture for 10 minutes to remove oxygen, it is heated to reflux, and then illuminated with a 300 W bulb while the acid chloride is dripped in. After 2–3 h it is cooled to room temperature and then stirred for 1–2 h with an excess of a saturated solution of commercial calcium hypochlorite at a temperature below 20° C. The mixture is transferred to a separatory funnel and washed with successive portions of water until all of the inorganic material is removed. Then the 2-pyridyl t-butyl disulfide coproduct is removed by washing with concentrated hydrochloric acid three times, water, saturated sodium bicarbonate, and brine. After drying over magnesium sulfate and filtration, concentration to constant volume yields a colored oil. Chromatography through silica gel (hexane; 10–15% ether-hexane elutions) yields 57% crude 32, mp 54°–56° C., purified by recrystallization from pentane, mp 63°–64°; proton NMR (CDCl$_3$, ppmδ): 2.70–3.10(1H, m, cage-CH), 3.28–3.77(6H, m, cage-CH), 3.80–4.45(4H, m, acetal-CH$_2$).

Step C. Cubanecarboxylic acid (53578-15-7) (33) is obtained from (32) by the method of Eaton and Cole, by refluxing the ketal in 25% aqueous KOH overnight. Extraction with methylene chloride, drying over magnesium sulfate, stripping the solvent, and recrystallization from pentane yields (33), mp 154°–155° C.; $\lambda_{max}$ (CCl$_4$) 5.91μ; proton NMR (CCl$_4$, ppm τ): –2.2(1H, s) , and 5.6–6.2(7H, m).

Step D. Iodocubane (74725-77-2) (34) is obtained by the procedure of Tsanaktsidis and Eaton, *Tetrahedron Lett.*, 30, 6967 (1989), incorporated herein by reference. Cubanecarboxylic acid (1.88 g, 6.85 mmol), oxalyl chloride (1.3 ml, 14.9 mmol, 2.5 eq), N,N-dimethylformamide (1 drop) and dry dichloromethane (10 ml), protected with a calcium chloride drying tube, are stirred at room temperature until homogeneous (1 hr), then concentrated in vacuo, and the crude cubanecarboxyl chloride allowed to reach ambient pressure under nitrogen. The residue is taken up in dry, thiophene-free benzene (10 ml). Separately, a system like that described above for the decarboxylation of 31 is assembled, and the benzene solution of the acid chloride is placed in the dropping funnel. The sodium salt of N-hydroxypyridine-2-thione (1.1 g, 7.4 mmol, 1.1 eq) dry benzene (25 ml), 2,2,2-=trifluoroiodoethane (stored over copper, 1.7 ml, 17.3 mmol, ~2.5 eq), and a catalytic amount of N,N-dimethylaminopyridine to accelerate the initial esterification, is added to the flask. The well-stirred suspension is brought to boiling and irradiated with a 300 W tungsten lamp. The benzene solution is added dropwise over 10 min, and the mixture allowed to reflux for 30 min. It is then cooled, washed successively with portions of water, concentrated HCl, and water, and dried over magnesium sulfate and potassium carbonate. It is distilled at atmospheric pressure, affording pure iodocubane, mp 32°–33° C.

The metallation of iodocubane to give cubyllithium has been reported by Eaton and Maggini, *J. Am. Chem. Soc.*, 110, 7231 (1988), but without an experimental procedure. It can be carried out by addition of n-butyllithium (8.0 ml of a 2.5M hexane solution, 20 mmol) from an air-tight syringe into iodocubane (4.6 g, 20 mmol) in ether (50 ml) in the apparatus described for the Grignard reagent above, but with a dropping funnel equipped with an ice jacket and containing ethylene oxide (0.99 ml, 0.88 g, 20 mmol) in ether (20 ml). When addition of the n-butyllithium is complete, the solution is allowed to stir for 30 minutes and then the ethylene oxide is added dropwise. The mixture is washed with water, the solvent stripped off, and the residue distilled under reduced pressure. The 2-(2-hydroxyethyl)cubane product can be confirmed by IR: 3300–3600 cm$^{-1}$ (broad, —OH); and proton NMR: 3.6 ppm δ(t, 3, CH$_2$OH). It is important not to use the other halo-substituted cubanes in place of iodocubane, since their rate of halogen-metal exchange is very slow, according to Eaton and Tsanaktsidis, *J. Am. Chem. Soc.*, 112, 876 (1990).

The 2-bromoethylcubane product is converted to the initiator composition following any of the procedures described in Example 1 for the analogous 1-(2-bromoethyl) adamantane.

EXAMPLE 7

Synthesis of Initiator Composition with I=Triazaadamantanyl, C=Octadecyl, and B=Triethoxysilyl Procedure 11, Step A. The preparation of 11-bromoundecene from 10-undecenol, available from Aldrich Chemical Co., follows the method of Hooz and Gilani, previously cited in Example 1, Procedure 2, Step C. Bergbreiter and Whitesides, cited previously in Example 1, Procedure 3, Step C, prepared the analogous 11-chloroundecene.

Step B. The preparation of 18-nonadecenoic acid follows Kabalka et al, *J. Radioanal. Chem.*, 65, 115 (1981), incorporated herein by reference. The magnesium chloride salt of 8-=bromooctanoic acid is prepared under positive nitrogen pressure by cooling a solution of acid (10 mmol) in anhydrous tetrahydrofuran (30–40 ml, freshly distilled from lithium aluminum hydride) to –20° C. and adding methylmagnesium chloride (2.9M solution in tetrahydrofuran, 10 mmol) dropwise with stirring. Temperature and stirring are maintained for 0.5 h after addition is complete. To this cooled solution is added first, an 0.20M solution of lithium copper tetrachloride in tetrahydrofuran (10 ml), and second, dropwise, a solution of Grignard reagent prepared from 11-bromoundecene (2.33 g, 10 mmol) and magnesium (0.24 g, 10 mmol) in sodium-dried diethyl ether (30 ml). The reaction mixture is stirred for an additional 3 h at –20° C., and then at ambient temperature overnight. The reaction mixture is worked up by pouring it into a mixture of dilute sulfuric acid, ether, and ice and extracting three times with ether. The combined ether extracts are extracted three times with 10% sodium bicarbonate solution, which results in a soapy emulsion. The combined emulsions are extracted with ether as well as possible, acidified, and extracted three times with ether. The combined ether layers are washed with ether and saturated sodium chloride solution, dried over anhydrous MgSO$_4$, and evaporated to dryness under reduced pressure to yield a white solid (crude yields of 80% are obtained). Recrystallization of the white solid from petroleum ether or petroleum ether-chloroform yields pure compound. The infrared spectrum (IR) has principal peaks at 1642 (w) (—CH=CH$_2$), 1710 (—CO$_2$H), 2860 and 2930 (—CH$_2$—) cm$^{-1}$. PMR (CCl$_4$) δ: 1.23 (s, 34H, —CH$_2$—), 2.1 (m, 4H, —CH=CH$_2$ and —CH$_2$CO$_2$H), 4.7–6.03 (m, 3H, —CH=CH$_2$), and 11.9 (s, 1H, —CO$_2$H). The melting point is 59°–60° C.

Step C. Conversion to the aldehyde follows Burgstahler, et al, *Synthesis*, 767 (1976), incorporated herein by reference, substituting 18-nonadecenoic acid for 9-octadecenoic acid. The acyl chloride is prepared by the action of redistilled oxalyl chloride on a 1M suspension of the anhydrous acid in benzene at 25°–30° C. One microdrop of dimethylformamide accelerates the reaction to completion within 20 min or less. After 30 min, the solvent and excess reagent are removed under aspirator vacuum. Fresh benzene is added, and the solution is treated with dry Nuchar, filtered, and reconcentrated. The acyl chloride is suitable for use without further purification.

The acyl chloride is added over a period of 3–5 min to a well-stirred suspension of hydrogen-equilibrated 5% Pd-BaSO$_4$ catalyst under dry hydrogen in tetrahydrofuran (distilled from lithium aluminum hydride) containing 1 equiv of redistilled 2,6-= dimethylpyridine per acyl chloride function. The concentration of acyl chloride should not exceed 0.25M. With 20–30 mg catalyst per mmol acyl chloride, hydrogen uptake occurs at a steady rate and should be complete in 1–2 h. Upon completion of the reduction, the solvent is removed under aspirator vacuum, ether or petroleum ether added, the mixture filtered, and the filtrate concentrated to give nearly pure aldehyde. Alternatively, the product is recovered by filtration, concentration of the filtrate, addition of ether, and washing with dilute hydrochloric acid and then aqueous sodium hydrogen carbonate. After drying over anhydrous magnesium sulfate the ether solution is evaporated and the residue distilled at about 120° C/0.01 torr.

Step D. The preparation of 2,2-dihydroxymethyl-18-nonadecenol (35) follows the procedure of Weibull and Matell, *Acta Chem. Scand.*, 16, 1062 (1962), incorporated herein by reference, substituting 18-nonadecenal for tetradecanal. A sample of 18-=nonadecenal (0.4 mol) and 40% aqueous formaldehyde (3 mol) are dissolved in 50% aqueous ethanol (500 ml). Potassium hydroxide (0.4 mol) dissolved in aqueous ethanol (200 ml) is dripped into the solution with stirring and cooling. The mixture is stirred at room temperature for 4 h and at 50° C. for an additional 2 h. The ethanol is removed and the resulting mixture extracted with ether. Evaporation of the ether yields a residue that is distilled in vacuum. Distillation of the residue yields a main fraction in about 50% yield with bp 187°–190° C./1 mm, further purified by recrystallization from ligroin.

Step E. Conversion of the hydroxyl groups to amines follows the procedure of Skarzewski and Daniluk, *Monatsh. Chem.*, 114, 1071 (1983), incorporated herein by reference, substituting 35 for 2,2-bis(hydroxymethyl)tetradecanol. A solution of 35 and methanesulfonyl chloride in dry pyridine is allowed to react for 2 h at 0°–10° C., then poured into ice-water, and extracted with dichloromethane. The extracts are washed with aqueous HCl, then with water and sodium bicarbonate solution, and dried over magnesium sulfate. Evaporation of the solvent and recrystallization gives product in over 90% yield. The IR spectrum in KBr contains bands corresponding to the SO$_3$ group, at about 1175 and 1345 cm$^{-1}$.

The sulfonate esters (16 mmol) are converted to amines by reacting them with sodium azide (120 mmol) and tetrabutylammonium chloride in dry hexamethylphosphoramide (25 ml) at 110°–115° C. for 5 hr. After cooling, the reaction mixture is diluted with an equal volume of water and extracted with n-hexane (3×40 ml). The combined extracts are washed with water, dried over magnesium sulfate and then over molecular sieves 4 Å, and the hexane is evaporated. IR bands at 1265 and 2150 cm$^{-1}$ confirm conversion to the azide, which is then dissolved in dry tetrahydrofuran (THF; 10 ml) and added dropwise to a stirred slurry of lithium aluminum hydride (51 mmol) in THF (85 ml) under nitrogen. The mixture is allowed to react at 60° C. overnight, and then 15% aqueous sodium hydroxide is slowly added until a white, granular precipitate forms. After filtration through Celite the THF is distilled off, and the residual oil dried azeotropically with benzene and then distilled under vacuum at about 0.05 mm Hg. Formation of the amine products can be confirmed by the characteristic IR bands at about 2860 and 2920 cm$^{-1}$.

Step F. Formation of the triazaadamantane ring follows the procedure of Stetter and Bockmann, *Chem. Ber.*, 84, 834 (1951), incorporated herein by reference. The triamine (13.7 mmol) is dissolved in 25 ml benzene and paraformaldehyde (41.1 mmol) is added. The mixture is refluxed in a Dean-Stark apparatus until carryover of water is no longer taking place (ca 2 h). After removal of the benzene in vacuo, a white substance, 8-(18-=octadecenyl)triazaadamantane or 8-(18-octadecenyl)-1,3,5-triaza=tricyclo(3.3.1.1$^{3,7}$)decane (36), remains, which can be obtained analytically pure by recrystallizing twice from a 20-fold excess of 70°–90° C. ligroin.

Procedure 12. Hydrosilylation of the double bond follows the procedure, for the analogous 1-eicosene (C$_{20}$H$_{40}$) with EtO$_3$SiH, of Marciniec et al, *J. Molec. Catal.*, 42, 195 (1987), incorporated herein by reference.

Step A. Tris (methytdiethoxysilylpropyl)amine is prepared by hydrosilylation of triallylamine with methyldiethoxysilane in the presence of chloroplatinic acid to yield 65% ((CH$_3$CH$_2$O)$_2$(CH$_3$)=Si(CH$_2$CH$_2$CH$_2$)$_3$N; bp 220–225 (11 Pa) $^1$H NMR (CCl$_4$, ppm δ): 2.5(t, 6H, Si(CH$_2$CH$_2$CH$_2$)), 0.9–1.7 (m, 6H, Si(CH$_2$CH$_2$CH$_2$)), 0.6(t, 6H, Si(CH$_2$CH$_2$CH$_2$)), 0.1(s, 9H, (CH$_3$)), 3.9(q, 12H, (CH$_3$CH$_2$O)), 1.2(t, 18H, (CH$_3$CH$_2$O)). The catalyst support is prepared by stirring chrysotile asbestos (13 g), glacial acetic acid (100 ml), and H$_2$O (40 ml) vigorously for 1 h at room temperature and then for 0.5 h under reflux, followed by filtering. Subsequently, CH$_3$COOH (100 ml), acetone (100 ml), and H$_2$O (20 ml) are added, and then ((C$_2$H$_5$O)$_2$(CH$_3$)Si(CH$_2$)$_3$)$_3$N (10 ml by 3.3 ml portions every 2 h). The system is heated and stirred for 6 h and left for equilibration (12 h at r.t.). Vacuum-dried support is heated at 150° C. (2 h) followed by washing with 1:1 acetone/H$_2$O and extraction with acetone in a Soxhlet apparatus (6 h). The (RhCl(c-C$_8$H$_{14}$)$_2$)$_2$ catalyst is synthesized following Porri et al, *Chem. Commun.*, 336 (1965), incorporated herein by reference. Cyclooctene (3 ml) and rhodium trichloride (1 g) are dissolved in 99.5% ethanol (20 ml), and the solution is kept at room temperature for 3 days, after which time red-brown crystals (0.85 g) of composition (C$_8$H$_{14}$)$_2$RhCl have been formed. The supported catalyst is obtained by equilibration (24 h, r.t.) of the support (2 g) with a solution of the rhodium complex (0.125 g) in chloroform (40 ml). Unattached complexes are washed out with chloroform in a Soxhlet apparatus (2 h). Then the supported catalyst is dried in vacuo.

Step B. Triethoxysilane, dry 36, and the catalyst are placed in a molar ratio of 1:1:2–3×10$^{-3}$ in a sealed glass ampoule of approximately 20 ml capacity, without solvent, at 80° C. under nitrogen for 2 h. The mixture is then filtered and the product isolated by g.l.c. (3 m 10% SE-30 on Chromosorb P). Procedure 13: Hydrosilylation is accomplished through the Grignard reagent, prepared by hydromagnesiation.

Step A: Magnesium hydrides are prepared following Ashby and Goel, *Inorg. Chem.*, 17, 1862 (1978), incorporated herein by reference. A slurry of MgH$_2$ in THF is prepared by the reaction of diethylmagnesium with LiAlH$_4$ in diethyl ether followed by filtration and washing of the white solid with ether and finally preparation of the slurry by adding THF to the ether wet solid. Diethylamine (0.33 g, 4.5 mmol) in THF (10 ml) is added dropwise to a MgH$_2$ (4.5 mmol) slurry in THF (30 ml) at $-78°$ C. The reaction mixture is slowly warmed to room temperature with continued stirring and is stirred further (for ~35 h) to give a clear solution.

Step B: The hydromagnesiation follows the procedure for analogous terminal olefinic bonds of Vostrikova et al, *Izvest. Akad. Nauk., Ser. Khim.*, 1901 (Engl. trans. 1724) (1983), incorporated herein by reference. To a freshly prepared solution of Et$_2$NMgH (10 mmol) in THF (10 ml) are added 36 (10 mmol) and the Cp$_2$TiCl$_2$ (titanocene dichloride) catalyst (0.2 mmol, available from Aldrich Chemical Co.), and the mixture is stirred at 60° C. for 4 h.

Step C: Silylation follows Szmant et al, *J. Org. Chem.*, 27, 261 (1962), incorporated herein by reference. The 36-magnesium hydride solution is added to tetraethoxysilane (2.5 mole Si/mole Mg) at 0° C. with little or no stirring. The reaction mixture is left at 5° C. for 24 h. The solvent is then distilled and the resulting mixture fractionated at reduced pressure, or purified chromatographically as in Procedure 12, Step B.

The following examples illustrate methods of surface preparation and monolayer deposition.

EXAMPLE 8

Initiator Film on Glass

Procedure 14 follows Sagiv, U.S. Pat. No. 4,539,061, col 7, lines 48–63. Glass microscope slides mounted on a glass holder are immersed in an ultrasonic cleaning tank containing an alkaline detergent cleaning solution of Trokil 764 (Benckiser, 10 g/l) and sonicated (40 kHz) for 7 min at 100° C. The holder with the slides is then rinsed in doubly distilled water, after which the following treatment is applied: 5 min of sonication in concentrated HNO$_3$ at room temperature, rinsed in doubly distilled water, 7 min of sonication in NaOH solution ($5.0 \times 10^{-3}$M) at room temperature, individual washing of each slide in a jet of doubly distilled water, and finally drying in a stream of hot air (hair dryer). Sets of about 50 slides are stored without contacting each other in covered glass containers, and are used within ca. 5–10 days after cleaning.

A layer of initiator compositions with a trichlorosilyl bonding segment, e.g., 18-(1-adamantyl)octadecyltrichlorosilane (12), Example 1, Procedure 5, is chemisorbed at ambient temperature from a stirred solution of the silane compound. The silane or mixture of silanes is dissolved at a concentration between $2.0 \times 10^{-3}$ to $5.0 \times 10^{-2}$M) in a solvent mixture of 80% n-hexadecane/12% CCl$_4$/8% CHCl$_{13}$. All solvents are passed through columns of alumina (Woelm-Pharma, W200 super, basic), and the chloroform is stabilized with absolute ethanol (1 vol %). The use of filler chains with initiator compositions bearing bulky substituents is recommended on p. 1061 of *J. Chim. Phys.*, 85, 1059 (1988), cited previously. For 12, the filler can be octadecyltrichlorosilane (OTS), available from Hüls America, Inc., and the 12/OTS ratio should be about 60/40.

The solid substrates are immersed in the silane solution for 1–2 min, with a subsequent quick withdrawal. Good monolayers are considered to be formed only on those substrates emerging dry from the silane solution (oleophobic). The monolayer-covered substrates are rinsed with chloroform and distilled water, to ensure stability of the formed films.

An improvement to the method, published in *J. Colloid Interfacial Sci.* 100, 465 (1984), on page 469, column 2, incorporated herein by reference, specifies bicyclohexyl as a replacement solvent for hexadecane.

EXAMPLE 9

Initiator Film on Polyethylene

Procedure 15 follows Sagiv, Isr. *J. Chem.*, 18, 339 (1979) incorporated herein by reference. Sulfuric acid oxidation of polyethylene is performed by dipping film strips (ca. 6 cm×2.6 cm×0.02 cm, low density PE, Suprathon 200 produced by Kalle & Co., AG) into a beaker containing (H$_2$SO$_4$+SO$_3$, 22%) at 40° C. for 5 min. The films are wetted by the reagent after ca. 0.5 min and can then be held below the liquid surface by magnetic stirring. The oxidized films are successively rinsed in a series of aqueous H$_2$SO$_4$ solutions with decreasing acid concentrations (in order to prevent heating of the films when coming in contact with water), then in bidistilled water, and finally dried in a stream of cold air (hair dryer). The oxidized films have a light grey tint, are transparent, and have a perfect hydrophilic surface (are wetted by water). No signs of etching are visible even after much longer reaction times.

Polyvinyl acetate-polyethylene (PVA-PE) composite films are prepared by immersing strips of oxidized polyethylene in a very dilute aqueous solution of PVA (0.2%) and then pulling them out. A thin film of PVA solution adheres perfectly to the hydrophilic PE surface, leaving, after slow drying at room temperature, an adsorbed ultra-thin PVA layer.

The composite films are mounted in a holder and stretched by hand up to their maximum elongation, while gently heating in a stream of hot air (hair dryer). The stretched films are transparent and have a very smooth surface. If protected from atmospheric contamination, they can be used over long periods of time after their preparation. Identical behavior is observed with films stretched a considerable time before or shortly before the absorption experiments. The film deformation upon stretching is quite reproducible; a four-fold elongation is typically achieved, while both the thickness and the width decrease by a factor of ca. two. The volume (density) remains approximately constant, and the surface area increases by a factor of ca. two. Not all types of PVA have the same mechanical and surface properties. The best results regarding the quality of adsorbed monolayers, the orientational effects, and the resistance to water treatment are achieved with Mowiol 28-89, supplied by Fabwerke Hoechst AG, Frankfurt.

The monolayers are deposited following the method of Example 8.

EXAMPLE 10

Initiator Film on Gold

Procedure 16 follows Porter et al, with the benefit of details reported by Nuzzo et al, *J. Am. Chem. Soc.*, 109, 3559 and 2358, respectively (1987), both incorporated herein by reference. Samples are made by the vapor deposition of gold (both >99.999% and 99.99% purity materials) from resistively heated tungsten boats onto clean silicon single crystals which have been polished to high optical quality. The substrate temperature is near but slightly above ambient temperature during the deposition. All depositions are made in a modified Varian evaporator equipped with a cryo-pump and operating with a base pressure of ~$1 \times 10^{-8}$ torr. Film thicknesses are measured with a quartz crystal thickness monitor. Typical mass coverages of ~2000 Å of gold are used. To promote adhesion of the gold film to a non-gold substrate, a preflash of ~150 Å of chromium is used. After the deposition, the chamber is back-filled with research-purity $N_2$; the samples are removed and subjected to chemical treatment or spectroscopic examination with minimal delay. Most experimental results are quite reproducible with longer delay times, up to the point of several days for samples in closed containers or several hours for samples exposed to the laboratory ambient. There is a significant tendency for the samples to become irreversibly contaminated under these latter conditions, and, as such, it is not recommended.

Assemblies of alkyl thiols, e.g., 18-(1-adamantyl)octadecylthiol (11), Example 1, Procedure 4, are spontaneously absorbed by immersing the substrate into dilute (0.1–1.0 mM) alkyl thiol solutions of hexadecane or absolute ethanol. For a 2-in. diameter surface and for a monolayer coverage of ~$10^{14}$ molecules/cm$^2$, those concentrations represent an approximately $10^3$- to $10^4$-fold excess of reagent for complete monolayer conversion. The hexadecane is purified by column chromatography just prior to use with activity-one alumina. The ethanol is commercial reagent grade (unadulterated) and used without further purification. Absolute methanol as well as other pure solvents such as $CHCl_3$ gives similar results. For layers containing initiator compositions with bulky initiating segments such as 11, the octadecyl thiols (e.g., octadecyl mercaptan, available from Aldrich Chemical Co.) are used as filler chains in a manner analogous to the use of the octadecyltrichlorosilanes of Example 8.

EXAMPLE 11

Initiator Film on Gallium Arsenide

Procedure 17 follows Sheen et al, *J. Am. Chem. Soc.*, 114, 1514 (1992) incorporated herein by reference. Semiinsulating (dopant density $10^{15}$ cm$^{-3}$) n-type GaAs single crystals of (100) orientation and polished on two sides (Macom Co., Boston, Mass.) are washed with pure ethanol and exposed to UV light to remove trace organics. The native surface oxide is stripped with concentrated HCl, to provide an arsenic-covered surface, rinsed with pure water, and immediately placed in $N_2$-purged PTFE containers with enough thiol to cover the wafer after the thiol melts. The wafers are heated at a temperature and for a time sufficient to give good quality monolayers, about 100° C. for 5 hr; insufficient reaction times or temperatures lead to incomplete, disordered monolayers. For layers containing initiator compositions with bulky initiating segments such as 11, the octadecyl thiols (e.g., octadecyl mercaptan, available from Aldrich Chemical Co. ) are used as filler chains in a manner analogous to the use of the octadecyltrichlorosilanes of Example 8.

EXAMPLE 12

Initiator Film on a Preformed SAM Procedure 18 follows Pomerantz et al, *Thin Solid Films*, 132, 153 (1985), incorporated herein by reference.

Step A. The synthesis of 12-bromododecene from 11-dodecenol, available from Nu-Chek-Prep, Inc., follows the method of Example 7, Procedure 11, Step A for the analogous synthesis of 11-=bromoundecene from 10-undecenol. An alternative preparation was published by Karo and Mori, *Agric. Biol. Chem.*, 49, 2479 (1985), incorporated herein by reference.

Step B. Methyl 22-tetracosenoate may be synthesized following Bergbreiter and Whitesides, previously cited in Example 1, Procedure 3, Step C, except that the copper reagent is generated from 12-bromododecene and coupled with the methyl ester of 11-=bromoundecanoic acid to yield methyl 22-tricosenoate.

Step C. Hydrosilylation of the double bond follows the procedure for the analogous methyl 10-undecenoate of Staroverov et al, *Zh. Obshch. Khim.*, 49, 2487 (Engl trans. 2196) (1979), incorporate herein by reference. Methyl 23-tricosenoate (0.1 mol) and trichlorsilane (0.1 mol) are heated for 8 h at 120° C. in the presence of 2 ml of a 0.1M solution $H_2PtCl_6$ in isopropyl alcohol. The reaction mixture is vacuum distilled to yield methyl 23-(trichlorosilyl)tricosanoate ($C_{24}$SME) (103946-41-4).

Step D. A monolayer film of $C_{24}$SME is deposited, e.g. on glass following Example 8, Procedure 14. The surface is activated (i.e., reduced to the alcohol) by the method of Pomerantz et al. The ester carbonyls are reduced to terminal hydroxyls by immersing the film-covered substrates for 15–30 min in a saturated solution of $LiAlH_4$ in dry diethyl ether at ambient temperature, followed by rinses with distilled water, concentrated HCl (30%), distilled water, and final Soxhlet extraction with hot $CHCl_3$ (20 min).

Step E. The second layer is deposited in the same manner as the first, using 2-(1-adamantyl) ethyltrichlorosilane instead of $C_{24}$SME. The 2-(1-adamantyl) ethyltrichlorosilane is available from Hüls America, Inc., but it may also be synthesized by any of the procedures of Example 1, terminating chain extension at a length of two carbons.

Procedure 19 follows Maoz and Sagiv, *Thin Solid Films*, 99, 235 (1983), substituting 24-tetracosenyltrichlorosilane for the analogous 15-hexadecenyltrichlorosilane. Reduction of 22-=tricosenoate, obtained from Procedure 18 above, to the alcohol follows the method of Nystrom and Brown, described for methyl 18(1-adamantyl)octadecanoate in Example 1, Procedure 3, Step D. Conversion to the silane follows Example 1, Procedure D.

The surface is activated (i.e., oxidized to the alcohol) by the method of Maoz and Sagiv. Film-coated substrates are dipped for 1 min into a solution of diborane (1M, Aldrich) kept under argon at room temperature, then dipped for 1 min into an alkaline hydrogen peroxide solution (30% $H_2O_2$ in 0.1M NaOH), and finally rinsed with distilled water and dried in a stream of air. The remainder of the procedure is the same as that of Procedure 18, Step D, above.

We claim:

1. A method for formation of a film on a solid substrate, said method comprising the steps of providing a solid substrate to be coated, coating said substrate with a solution of a self-assembling film-forming material to form an intermediate self-assembled film over said substrate surface, said self-assembled film comprising molecules having bonding segments at one end of the molecule that bond with the substrate and, at the other end of the molecule, remote from the substrate surface, initiator segments capable of initiating formation of said thin film, and exposing said substrate having said self-assembled film over its surface to a gaseous environment under conditions whereby said thin film coating is formed over said self assembled film when said gaseous environment contacts said initiator segments, said thin film overlying said self-assembled film and being of a material differing from the material of said intermediate self-assembled film.

2. The method of claim 1 where the bonding segment of said molecules is selected from the group consisting of silanes, silanols, silazanes, tin functionalities, thio functionalities, sulfate or sulfonic groups, phosphines, phosphates, titanates, zirconates, boranes, aluminates; carboxylic acids, amides, acyl halides, hydrazides, amines, pyridine; hydrazines; isonitriles; diazonium salts; halides; aldehydes; and hydroxyl groups.

3. The method of claim 1 where the bonding segment of said molecules is a silane.

4. The method of claim 1 where the bonding segment of said molecules is a thiol.

5. The method of claim 1 where the initiating segment of said molecules is a hydrocarbon radical.

6. The method of claim 1 where the initiating segment of said molecules has a ring structure.

7. The method of claim 1 where the initiating segment of said molecules has a cage structure.

8. The method of claim 7 where the cage structure is a radical formed from a member selected from the group consisting of adamantane, diamantane, and cubane.

9. The method of claim 1 where said environment forms a thin ceramic film in contact with the initiator segment of said self-assembling film.

10. A method for formation of a diamond film on a solid substrate, said method comprising the steps of providing a solid substrate to be coated, coating said substrate with a solution of a self-assembling film-forming material to form an intermediate layer of a self-assembled film on said substrate, said self-assembled film comprising molecules having bonding segments at one end of the molecule that bond with the substrate and, at the other end of the molecule, remote from the substrate surface, hydrocarbon initiator segments capable of initiating formation of said diamond coating, and exposing said substrate having said self-assembled film over its surface to a gaseous environment under conditions that deposit diamond when in contact with said initiator segments to form an article comprising a substrate coated with a thin diamond film through an intermediate layer of said self-assembled film.

11. The method of claim 10 where the substrate is selected from the group consisting of glass, alumina, aluminum, copper, germanium, platinum, silicon, zinc selenide, poly(vinyl acetate), and polyethylene, and the bonding segment of said molecules is a silane.

12. The method of claim 10 where the substrate is selected from the group consisting of copper, gold, gallium arsenide, platinum, and silver, and the bonding segment of said molecules is a thiol.

13. The method of claim 10 where the initiating segment of said molecules is a hydrocarbon radical.

14. The method of claim 13 where the initiating segment of said molecules has a ring structure.

15. The method of claim 13 where the initiating segment of said molecules has a cage structure.

16. The method of claim 15 where the cage structure is a radical formed from a member selected from the group consisting of adamantane, diamantane, and cubane.

17. The method of claim 10 where the environment capable of depositing diamond in contact with the initiator is a mixture of a hydrocarbon gas and hydrogen.

* * * * *